United States Patent
Saida et al.

(10) Patent No.: US 8,508,979 B2
(45) Date of Patent: Aug. 13, 2013

(54) MAGNETIC RECORDING ELEMENT AND NONVOLATILE MEMORY DEVICE

(75) Inventors: Daisuke Saida, Tokyo (JP); Minoru Amano, Kanagawa-ken (JP); Junichi Ito, Kanagawa-ken (JP); Yuichi Ohsawa, Kanagawa-ken (JP); Saori Kashiwada, Kanagawa-ken (JP); Chikayoshi Kamata, Kanagawa-ken (JP); Tadaomi Daibou, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 85 days.

(21) Appl. No.: 13/228,040

(22) Filed: Sep. 8, 2011

(65) Prior Publication Data
US 2012/0236633 A1   Sep. 20, 2012

(30) Foreign Application Priority Data
Mar. 17, 2011   (JP) .................... 2011-059179

(51) Int. Cl.
  *G11C 11/00*   (2006.01)
(52) U.S. Cl.
  USPC .......................................... 365/148
(58) Field of Classification Search
  USPC .......................................... 365/148
  See application file for complete search history.

(56) References Cited

U.S. PATENT DOCUMENTS

| | | | |
|---|---|---|---|
| 7,173,848 B2* | 2/2007 | Ju | 365/173 |
| 8,014,193 B2 | 9/2011 | Nakayama et al. | |
| 2009/0015958 A1 | 1/2009 | Nakamura et al. | |
| 2009/0244792 A1* | 10/2009 | Nakayama et al. | 360/324.11 |
| 2010/0020592 A1* | 1/2010 | Hosotani et al. | 365/158 |
| 2012/0061784 A1* | 3/2012 | Nakamura et al. | 257/421 |
| 2012/0087185 A1* | 4/2012 | Zhou et al. | 365/171 |
| 2013/0069185 A1* | 3/2013 | Saida et al. | 257/422 |

FOREIGN PATENT DOCUMENTS

| | | |
|---|---|---|
| JP | 2006-516360 A | 6/2006 |
| JP | 2008-252037 A | 10/2008 |
| JP | 2009-21352 | 1/2009 |
| JP | 2009-21352 A | 1/2009 |
| JP | 2009-194070 A | 8/2009 |

OTHER PUBLICATIONS

U.S. Appl. No. 13/227,959, filed Sep. 8, 2011, Saida, et al.
U.S. Appl. No. 13/416,076, filed Mar. 9, 2012, Saida, et al.

(Continued)

*Primary Examiner* — Hoai V Ho
*Assistant Examiner* — Min Huang
(74) *Attorney, Agent, or Firm* — Oblon, Spivak, McClelland, Maier & Neustadt, L.L.P.

(57) ABSTRACT

According to one embodiment, a magnetic recording element includes a stacked body. The stacked body includes a first and a second stacked unit. The first stacked unit includes first and second ferromagnetic layers and a first nonmagnetic layer. The first nonmagnetic layer is provided between the first and second ferromagnetic layers. The second stacked unit is stacked with the first stacked unit and includes third and fourth ferromagnetic layers and a second nonmagnetic layer. The fourth ferromagnetic layer is stacked with the third ferromagnetic layer. The second nonmagnetic layer is provided between the third and fourth ferromagnetic layers. An outer edge of the fourth ferromagnetic layer includes a portion outside an outer edge of the first stacked unit in a plane. A magnetization direction of the second ferromagnetic layer is determined by causing a spin-polarized electron and a rotating magnetic field to act on the second ferromagnetic layer.

20 Claims, 13 Drawing Sheets

(56) References Cited

OTHER PUBLICATIONS

U.S. Appl. No. 13/416,724, filed Mar. 9, 2012, Saida, et al.
U.S. Appl. No. 13/416,408, filed Mar. 9, 2012, Saida, et al.
U.S. Appl. No. 13/210,678, filed Aug. 6, 2011, Tadaomi Daibou, et al.
U.S. Appl. No. 13/037,592, filed Mar. 1, 2011, Daisuke Saida, et al.
U.S. Appl. No. 12/396,778, filed Mar. 3, 2009, Masahiko Nakayama, et al.
U.S. Appl. No. 13/601,343, filed Aug. 31, 2012, Saida, et al.
Office Action issued Feb. 19, 2013, in Japanese Patent Application No. 2011-059179 with English translation.

* cited by examiner

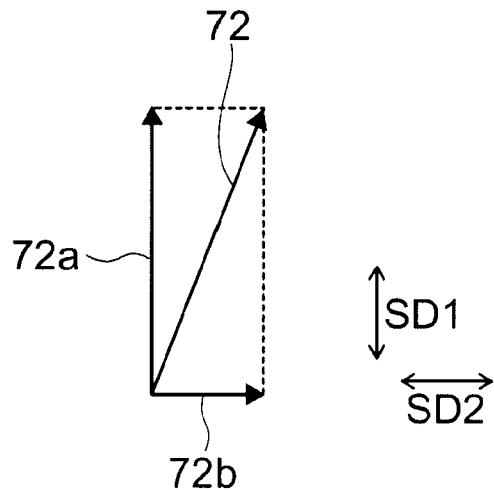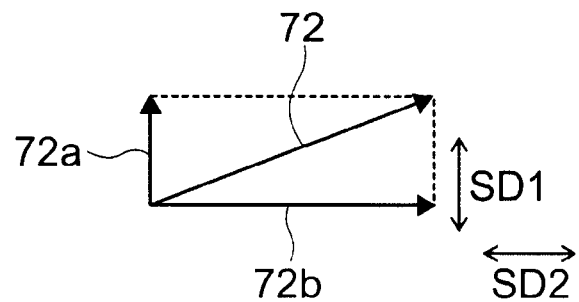
FIG. 2A　　　　　　　FIG. 2B
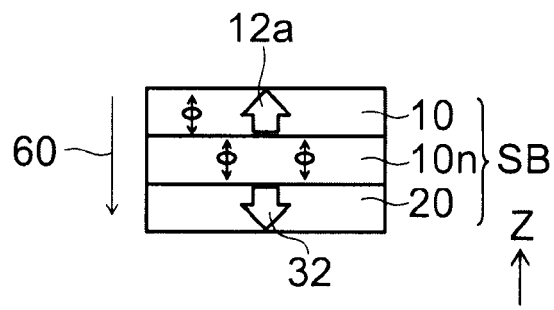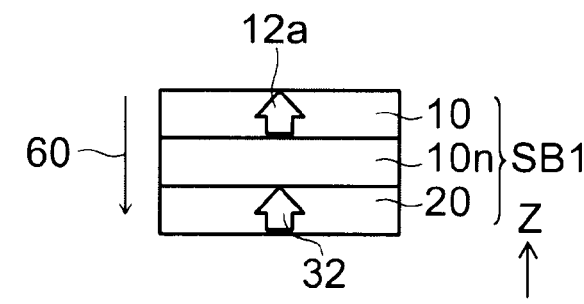
FIG. 3A　　　　　　　FIG. 3B
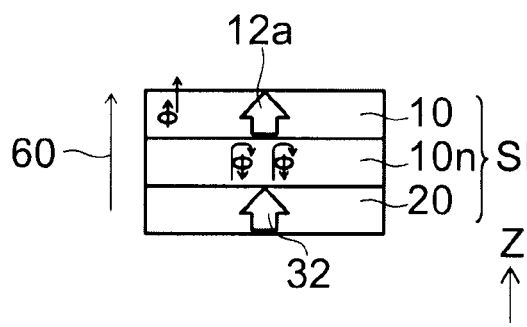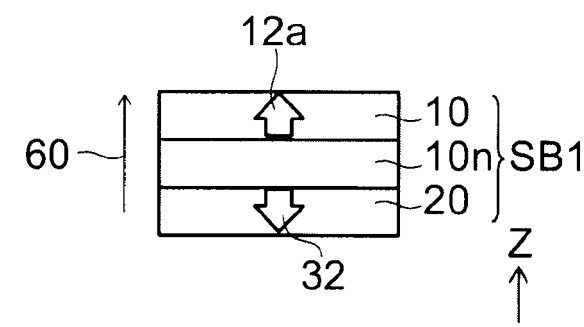
FIG. 3C　　　　　　　FIG. 3D

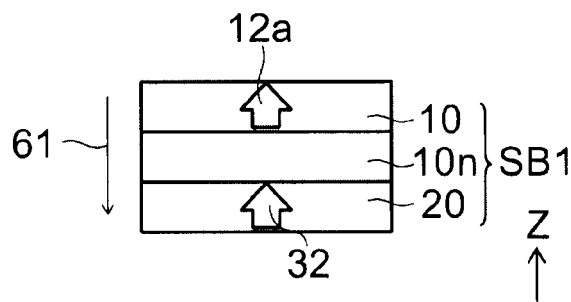
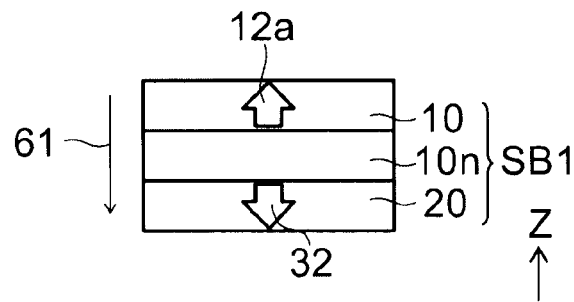
FIG. 4A          FIG. 4B
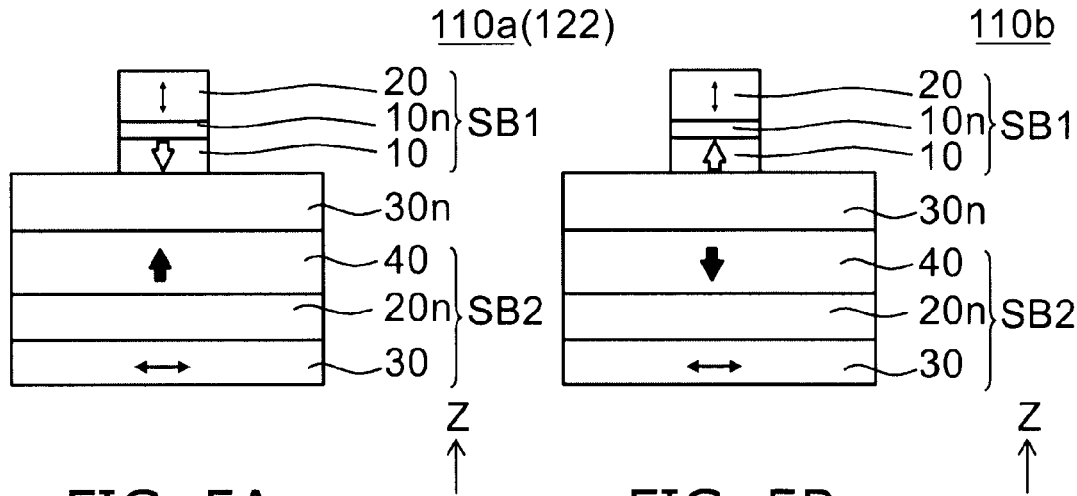
FIG. 5A          FIG. 5B
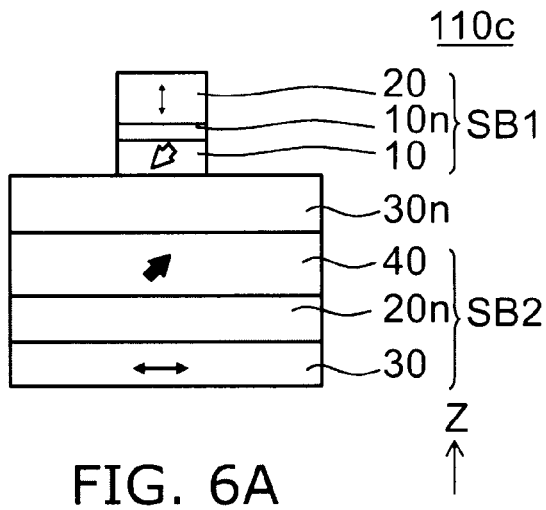
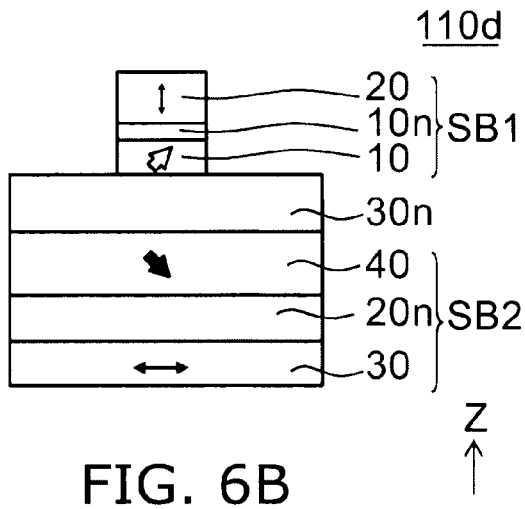
FIG. 6A          FIG. 6B FIG. 10A
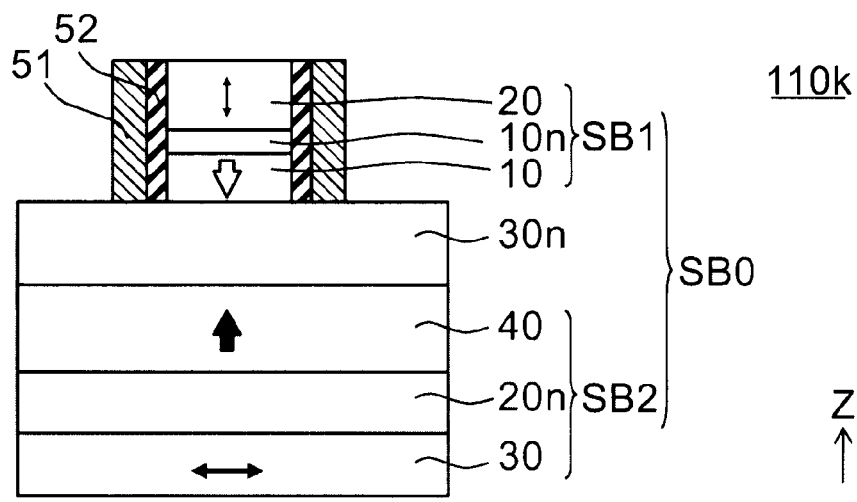
FIG. 10B
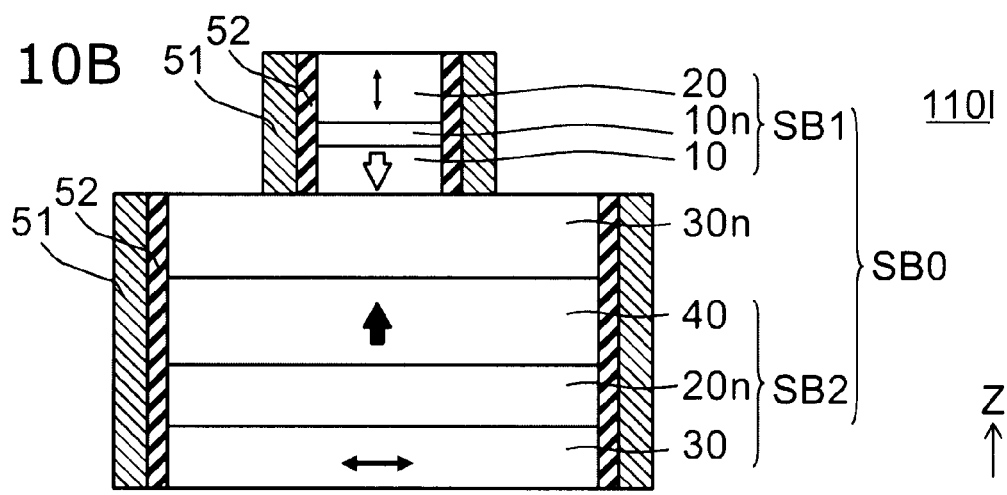
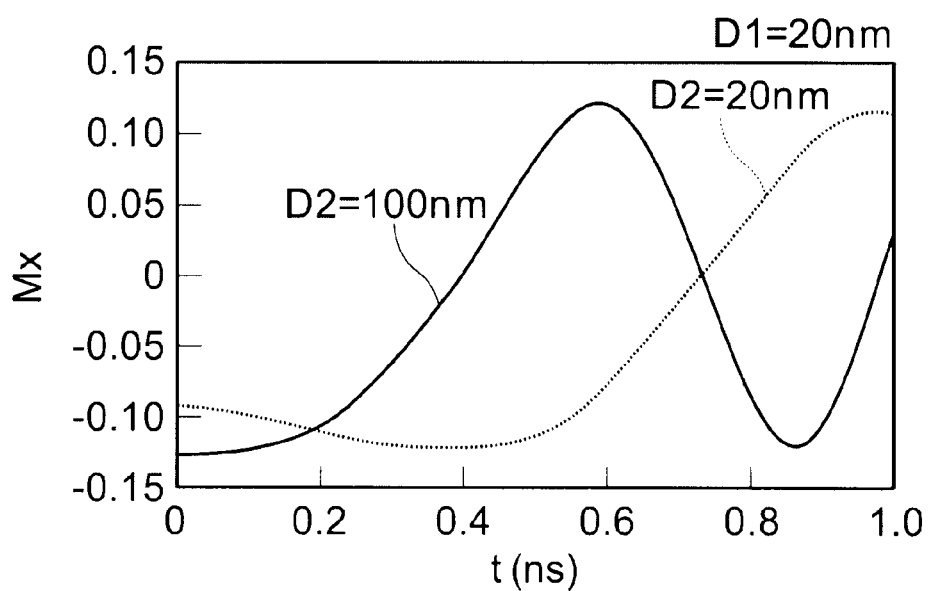
FIG. 11

US 8,508,979 B2

MAGNETIC RECORDING ELEMENT AND NONVOLATILE MEMORY DEVICE

CROSS-REFERENCE TO RELATED APPLICATIONS

This application is based upon and claims the benefit of priority from the prior Japanese Patent Application No. 2011-059179, filed on Mar. 17, 2011; the entire contents of which are incorporated herein by reference.

FIELD

Embodiments described herein relate generally to a magnetic recording element and a nonvolatile memory device.

BACKGROUND

Some magnetic random access memories (MRAM) have a configuration in which a magnetic tunnel junction (MTJ) element exhibiting the tunneling magnetoresistive (TMR) effect is used for a data memory unit. The configuration is drawing attention as a high-speed and large-capacity nonvolatile memory. Writing to the recording layer of the MTJ element is performed by, for example, a spin-transfer torque writing system. In the system, for example, a current is passed directly through the MTJ element and a spin-transfer torque injected from the reference layer of the MTJ element is used to reverse the magnetization of the recording layer. To achieve high-speed operation of memory, it is necessary for the magnetization reversal during writing to the MTJ element to occur more quickly.

BRIEF DESCRIPTION OF THE DRAWINGS

FIG. 2A and FIG. 2B are schematic views showing magnetization;

FIG. 3A to FIG. 3D are schematic views showing the operation of the magnetic recording element according to the embodiment;

FIG. 4A and FIG. 4B are schematic views showing the operation of the magnetic recording element according to the embodiment;

FIG. 5A and FIG. 5B are schematic cross-sectional views showing magnetic recording elements according to a second embodiment;

FIG. 6A and FIG. 6B are schematic cross-sectional views showing magnetic recording elements according to the second embodiment;

FIG. 10A and FIG. 10B are schematic cross-sectional views showing magnetic recording elements according to a sixth embodiment;

FIG. 11 is a graph showing characteristics of the magnetic recording element;

DETAILED DESCRIPTION

Figure 1A:
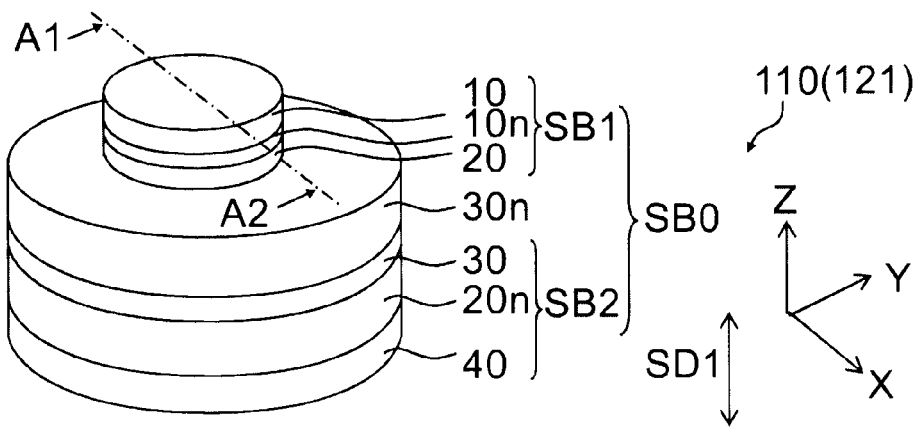
FIG. 1A to FIG. 1C are schematic views showing a magnetic recording element according to a first embodiment.

In general, according to one embodiment, a magnetic recording element includes a stacked body. The stacked body includes a first stacked unit and a second stacked unit. The first stacked unit includes a first ferromagnetic layer, a second ferromagnetic layer and a first nonmagnetic layer. A magnetization of the first ferromagnetic layer is fixed in a first direction having a component perpendicular to a layer surface of the first ferromagnetic layer. A direction of a magnetization of the second ferromagnetic layer is variable in a direction perpendicular to a layer surface of the second ferromagnetic layer. The first nonmagnetic layer is provided between the first ferromagnetic layer and the second ferromagnetic layer. The second stacked unit is stacked with the first stacked unit along a stacking direction. The first ferromagnetic layer, the second ferromagnetic layer, and the first nonmagnetic layer are stacked along the stacking direction. The second stacked unit includes a third ferromagnetic layer, a fourth ferromagnetic layer and a second nonmagnetic layer. A direction of a magnetization of the third ferromagnetic layer is variable in directions parallel to a layer surface of the third ferromagnetic layer. The fourth ferromagnetic layer is stacked with the third ferromagnetic layer along the stacking direction. A magnetization of the fourth ferromagnetic layer is fixed in a second direction having a component perpendicular to a layer surface of the fourth ferromagnetic layer. The second nonmagnetic layer is provided between the third ferromagnetic layer and the fourth ferromagnetic layer. An outer edge of the fourth ferromagnetic layer projected onto a plane normal to the stacking direction includes a portion outside an outer edge of the first stacked unit in the plane. A direction of the magnetization of the second ferromagnetic layer is configured to be determined to a direction in accordance with a direction of a current by causing an electron whose spin is polarized by passing the current through the stacked body along the stacking direction to act on the second ferromagnetic layer and by causing a rotating magnetic field generated from a precession of the magnetization of the third ferromagnetic layer to act on the second ferromagnetic layer.

In general, according to another embodiment, a nonvolatile memory device includes a magnetic recording element, a first interconnection and a second interconnection. The magnetic recording element includes a stacked body. The stacked body includes a first stacked unit and a second stacked unit. The first stacked unit includes a first ferromagnetic layer, a second ferromagnetic layer and a first nonmagnetic layer. A magnetization of the first ferromagnetic layer is fixed in a first direction having a component perpendicular to a layer surface of the first ferromagnetic layer. A direction of a magnetization of the second ferromagnetic layer is variable in directions perpendicular to a layer surface of the second ferromagnetic layer. A first nonmagnetic layer is provided between the first ferromagnetic layer and the second ferromagnetic layer. The second stacked unit is stacked with the first stacked unit along a stacking direction. The first ferromagnetic layer, the second ferromagnetic layer, and the first nonmagnetic layer are stacked along the stacking direction. The second stacked unit includes a third ferromagnetic layer, a fourth ferromagnetic layer and a second nonmagnetic layer. A direction of a magnetization of the third ferromagnetic layer is variable in directions parallel to a layer surface of the third ferromagnetic layer. A fourth ferromagnetic layer is stacked with the third ferromagnetic layer along the stacking direction. A magnetization of the fourth ferromagnetic layer is fixed in a second direction having a component perpendicular to a layer surface of the fourth ferromagnetic layer. A second nonmagnetic layer is provided between the third ferromagnetic layer and the fourth ferromagnetic layer. An outer edge of the fourth ferromagnetic layer projected onto a plane normal to the stacking direction includes a portion outside an outer edge of the first stacked unit in the plane. A direction of the magnetization of the second ferromagnetic layer is configured to be determined to a direction in accordance with a direction of a current by causing an electron whose spin is polarized by passing the current through the stacked body along the stacking direction to act on the second ferromagnetic layer and by causing a rotating magnetic field generated from a precession of the magnetization of the third ferromagnetic layer to act on the second ferromagnetic layer. The first interconnection is connected to one end of the magnetic recording element. The second interconnection is connected to another end of the magnetic recording element.

Various embodiments will be described hereinafter with reference to the accompanying drawings.

The drawings are schematic or conceptual; and the relationships between the thickness and width of portions, the proportional coefficients of sizes among portions, etc., are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

Figure 1B:
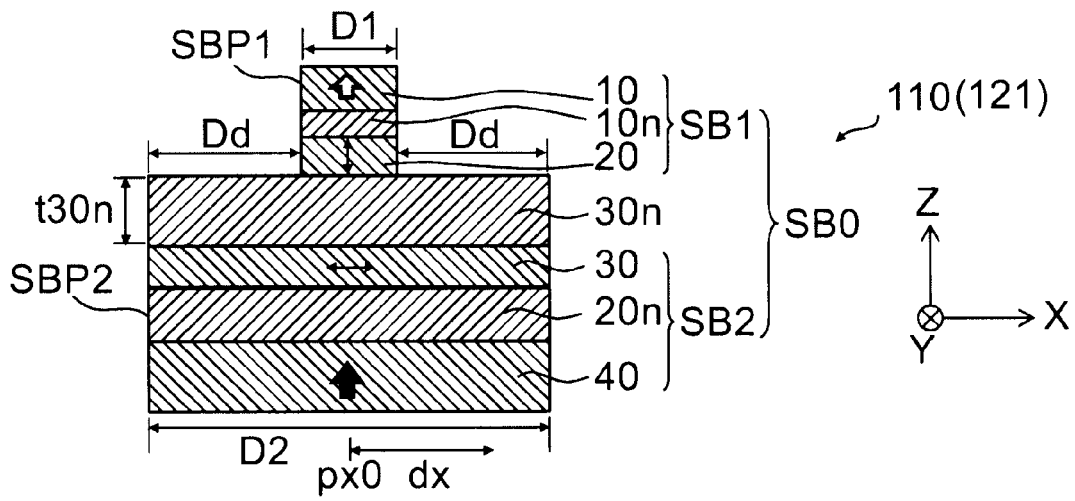
Figure 1C:
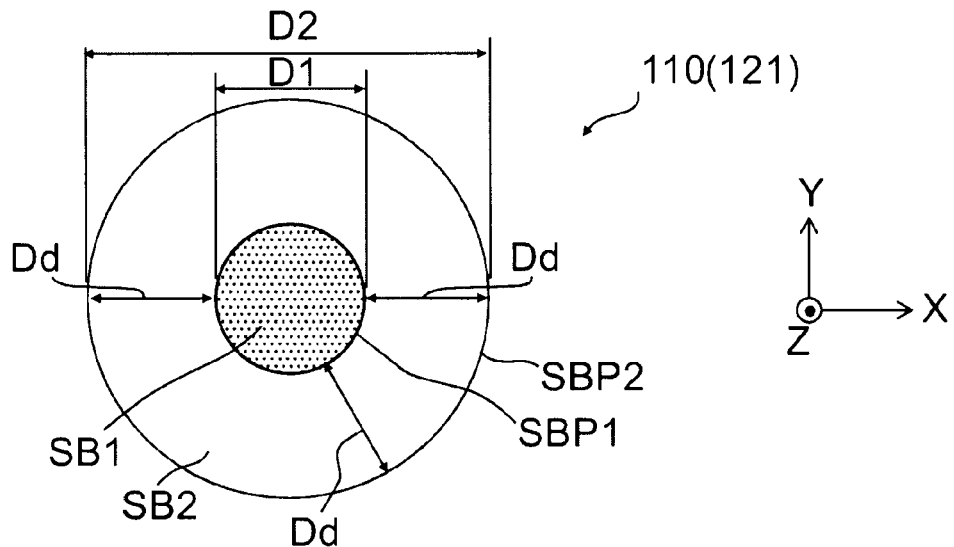

FIG. 1A to FIG. 1C are schematic views illustrating the configuration of a magnetic recording element according to a first embodiment.

FIG. 1A is a schematic perspective view. FIG. 1B is a cross-sectional view taken along line A1-A2 of FIG. 1A. FIG. 1C is a schematic plan view.

As shown in FIG. 1A to FIG. 1C, a magnetic recording element 110 according to the embodiment includes a stacked body SB0. The stacked body SB0 includes a first stacked unit SB1 and a second stacked unit SB2.

The first stacked unit SB1 includes a first ferromagnetic layer 10, a second ferromagnetic layer 20, and a first nonmagnetic layer 10n.

In the first ferromagnetic layer 10, the magnetization (the magnetization of the first ferromagnetic layer 10) is fixed in a first direction having a component perpendicular to the film surface. In the second ferromagnetic layer 20, the direction of the magnetization (the magnetization of the second ferromagnetic layer 20) is variable in directions perpendicular to the film surface. The first nonmagnetic layer 10n is provided between the first ferromagnetic layer 10 and the second ferromagnetic layer 20. The "film surface" is a surface parallel to the major surface of the layer and corresponds to a "layer surface."

That is, the first ferromagnetic layer 10, the second ferromagnetic layer 20, and the first nonmagnetic layer 10n are stacked. The direction along which the first ferromagnetic layer 10, the second ferromagnetic layer 20, and the first nonmagnetic layer 10n are stacked is referred to as a stacking direction SD1. The stacking direction SD1 is, for example, a direction perpendicular to the film surface of the first ferromagnetic layer 10.

For convenience of description, the stacking direction SD1 is taken as a Z-axis. One axis perpendicular to the Z-axis is taken as an X-axis. The axis perpendicular to the Z-axis and the X-axis is taken as a Y-axis.

In the specification of this application, "stack" includes not only the case where a plurality of layers are stacked in contact with each other but also the case where a plurality of layers are stacked via other components.

The second stacked unit SB2 is stacked with the first stacked unit SB1 along the stacking direction SD1. The second stacked unit SB2 includes a third ferromagnetic layer 30, a fourth ferromagnetic layer 40, and a second nonmagnetic layer 20n. In the third ferromagnetic layer 30, the direction of the magnetization (the magnetization of the third ferromagnetic layer 30) is variable in directions parallel to the film surface. The fourth ferromagnetic layer 40 is stacked with the third ferromagnetic layer 30 along the stacking direction SD1. In the fourth ferromagnetic layer 40, the magnetization (the magnetization of the fourth ferromagnetic layer 40) is fixed in a second direction having a component perpendicular to the film surface. The second nonmagnetic layer 20n is provided between the third ferromagnetic layer 30 and the fourth ferromagnetic layer 40.

That is, the third ferromagnetic layer 30, the fourth ferromagnetic layer 40, and the second nonmagnetic layer 20n are stacked with the first ferromagnetic layer 10, the second ferromagnetic layer 20, and the first nonmagnetic layer 10n along the stacking direction SD1. As described later, the order of the layers may be variously altered.

The outer edge of the fourth ferromagnetic layer 40 in a plane normal to the stacking direction SD1 includes a portion outside the outer edge of the first stacked unit SB1 in the plane. That is, the outer edge of the fourth ferromagnetic layer 40 projected onto the plane normal to the stacking direction SD1 includes a portion outside the outer edge of the first stacked unit SB1 in the plane. In this example, the third ferromagnetic layer 30, the second nonmagnetic layer 20n, and the fourth ferromagnetic layer 40 have the same size (width). Therefore, the position of the outer edge of the fourth ferromagnetic layer 40 in the plane normal to the stacking direction SD1 is the same as the position of the outer edge of the second stacked unit SB2 in the plane normal to the stacking direction SD1. The position of the outer edge of the fourth ferromagnetic layer in the plane normal to the stacking direction SD1 is substantially the same as the position of the outer edge of the third ferromagnetic layer 30 in the plane, and substantially the same as the position of the outer edge of the second nonmagnetic layer 20n in the plane.

On the other hand, the first ferromagnetic layer 10, the first nonmagnetic layer 10n, and the second ferromagnetic layer 20 have the same size (width). Therefore, the position of the outer edge of the first ferromagnetic layer 10, the position of the outer edge of the first nonmagnetic layer 20n, and the position of the outer edge of the second ferromagnetic layer 20 in the plane normal to the stacking direction SD1 are the same as the position of the outer edge of the first stacked unit SB1 in the plane normal to the stacking direction SD1. The position of the outer edge of the first ferromagnetic layer 10 in the plane normal to the stacking direction SD1 is substantially the same as the position of the outer edge of the second ferromagnetic layer 20 in the plane, and substantially the same as the position of the outer edge of the first nonmagnetic layer 10n in the plane.

As described later, for example, the size (width) of the third ferromagnetic layer 30 may be different from the size (width) of the fourth ferromagnetic layer 40 in the second stacked unit SB2. Also in this case, in the embodiment, the outer edge of the fourth ferromagnetic layer 40 includes a portion outside the outer edge of the first stacked unit SB1. Hereinbelow, for the sake of simple description, the case is described where the third ferromagnetic layer 30, the second nonmagnetic layer 20n, and the fourth ferromagnetic layer 40 have the same size (width). Further, the outer edge of the second stacked unit SB2 is described as the outer edge of the fourth ferromagnetic layer 40.

In this example, when viewed along the stacking direction SD1, the outer edge of the fourth ferromagnetic layer 40, that is, the outer edge of the second stacked unit SB2 (a second outer edge SBP2) includes a portion outside the outer edge of the first stacked unit SB1 (a first outer edge SBP1). In other words, in a planar view, the second outer edge SBP2 of the second stacked unit SB2 includes a portion outside the first outer edge SBP1 of the first stacked unit SB1.

In this example, the outer edge of the second stacked unit SB2 (the second outer edge SBP2) is located outside the outer edge of the first stacked unit SB1 (the first outer edge SBP1). Specifically, the entire second outer edge SBP2 of the second stacked unit SB2 is located outside the first outer edge SBP1 of the first stacked unit SB1. In other words, the second outer edge SBP2 of the second stacked unit SB2 when viewed along the stacking direction SD1 is outside the first outer edge SBP1 of the first stacked unit SB1 when viewed along the stacking direction SD1.

For example, the distance between the second outer edge SBP2 of the second stacked unit SB2 and the first outer edge SBP1 of the first stacked unit SB1 is a distance Dd. The distance Dd is, for example, a distance along an arbitrary axis in the X-Y plane, for example a distance along the X-axis or a distance along the Y-axis. The distance Dd is the distance between the outer edge of the fourth ferromagnetic layer 40 and the first outer edge SBP1 of the first stacked unit SB1.

For example, the width of the second stacked unit SB2 along the X-axis is larger than the width of the first stacked unit SB1 along the X-axis. For example, the width of the second stacked unit SB2 along the Y-axis is larger than the width of the first stacked unit SB1 along the Y-axis.

For example, the cross-sectional area of the second stacked unit SB2 when cut along the X-Y plane is larger than the cross-sectional area of the first stacked unit SB1 when cut along the X-Y plane.

In the magnetic recording element 110, an electron whose spin is polarized by passing a current through the stacked body SB0 along the stacking direction SD1 is caused to act on the second ferromagnetic layer 20, and a rotating magnetic field generated from the precession of the magnetization of the third ferromagnetic layer 30 is caused to act on the second ferromagnetic layer 20. Thereby, the direction of the magnetization of the second ferromagnetic layer 20 can be determined to a direction in accordance with the direction of the current. The current mentioned above flows in a direction substantially perpendicular to the film surfaces of the layers of the stacked body SB0.

In the magnetic recording element 110, the second stacked unit SB2 functions as a magnetic field generation source. The first stacked unit SB1 functions as a magnetic recording unit. Hereinafter, the second stacked unit SB2 may be referred to as the magnetic field generation source and the first stacked unit SB1 may be referred to as the magnetic recording unit, as appropriate.

The first ferromagnetic layer 10 is, for example, a first magnetization fixed layer. In the second ferromagnetic layer 20, the magnetization easy axis is in a direction substantially perpendicular to the film surface. The second ferromagnetic layer 20 functions as a magnetic recording layer. The first nonmagnetic layer 10n functions as a first spacer layer. The first stacked unit SB1 including the first ferromagnetic layer 10, the first nonmagnetic layer 10n, and the second ferromagnetic layer 20 has a structure of, for example, MTJ (magnetic tunnel junction).

The third ferromagnetic layer 30 functions as a magnetization rotation layer. The fourth ferromagnetic layer 40 functions as a second magnetization fixed layer in which the magnetization is fixed in a direction substantially perpendicular to the film surface. The second nonmagnetic layer 20n functions as a second spacer layer.

In the magnetic recording element 110 having such a configuration, the magnetization reversal during writing occurs more quickly. Characteristics of the magnetic recording element 110 are described later.

As illustrated in FIG. 1C, in this example, the shapes of the first stacked unit SB1 and the second stacked unit SB2 when viewed along the Z-axis are a circle (including a flat circle). In the embodiment, however, the shapes of the first stacked unit SB1 and the second stacked unit SB2 when viewed along the Z-axis are arbitrary.

In the magnetic recording element 110, the stacked body SB0 further includes a third nonmagnetic layer 30n. The third nonmagnetic layer 30n is provided between the first stacked unit SB1 and the second stacked unit SB2. That is, the third nonmagnetic layer 30n is provided between the second ferromagnetic layer 20 and the third ferromagnetic layer 30. The third nonmagnetic layer 30n is provided as necessary and may be omitted.

A perpendicular magnetic film, for example, is used as the first ferromagnetic layer 10, the second ferromagnetic layer 20, and the fourth ferromagnetic layer 40. An in-plane magnetic film, for example, is used as the third ferromagnetic layer.

FIG. 2A and FIG. 2B are schematic views illustrating magnetization.

FIG. 2A illustrates the magnetization in a perpendicular magnetic film. FIG. 2B illustrates the magnetization in an in-plane magnetic film.

As shown in FIG. 2A and FIG. 2B, one direction perpendicular to the stacking direction SD1 is taken as an in-plane direction SD2. The in-plane direction SD2 is a direction in the X-Y plane. A magnetization 72 has a magnetization oblique shadow component in a direction perpendicular to the film surface (a magnetization component 72a parallel to the stacking direction SD1) and a magnetization oblique shadow component in a direction parallel to the film surface (a magnetization component 72b parallel to the in-plane direction SD2).

As shown in FIG. 2A, the perpendicular magnetic film has a magnetization state in which the magnetization component 72a perpendicular to the film surface is larger than the magnetization component 72b parallel to the film surface. In the perpendicular magnetic film, the direction of the magnetization is preferably substantially perpendicular to the film surface in view of operating characteristics.

As shown in FIG. 2B, the in-plane magnetic film has a magnetization state in which the magnetization component 72b parallel to the film surface is larger than the magnetization component 72a perpendicular to the film surface. In the in-plane magnetic film, the direction of the magnetization is preferably substantially parallel to the film surface in view of operating characteristics.

For convenience of description, the direction from the first stacked unit SB1 toward the second stacked unit SB2 is referred to as "downward" or a "downward direction." The direction from the second stacked unit SB2 toward the first stacked unit SB1 is referred to as "upward" or an "upward direction."

As described above, the magnetization of the first ferromagnetic layer 10 is substantially fixed in the first direction. The magnetization of the fourth ferromagnetic layer 40 is substantially fixed in the second direction.

As illustrated in FIG. 1B, in the magnetic recording element 110, the first direction is the upward direction, and also the second direction is the upward direction. However, as described later, the first direction and the second direction may be variously altered.

In the magnetic recording element 110, for example, an electronic current can be passed through the stacked body SB0 with a pair of electrodes (not shown) provided across the stacked body SB0. The electronic current is a flow of electrons. When a current flows upward, the electronic current flows downward.

The second ferromagnetic layer 20 takes the role of recording data. The magnetization of the second ferromagnetic layer 20 can be reversed comparatively easily. The third ferromagnetic layer 30 takes the role of generating a high frequency magnetic field during writing.

When the electronic current is passed in the direction perpendicular to the film surface, the magnetization in the third ferromagnetic layer 30 of the magnetic field generation source precesses. Thereby, a rotating magnetic field (a high frequency magnetic field) is generated. The frequency of the high frequency magnetic field is, for example, about 1 GHz to 60 GHz. The high frequency magnetic field has a component in a direction perpendicular to the magnetization of the second ferromagnetic layer 20 (a component in the direction of the magnetization hard axis of the second ferromagnetic layer 20). Therefore, at least part of the high frequency magnetic field generated from the third ferromagnetic layer 30 is applied in the direction of the magnetization hard axis of the second ferromagnetic layer 20. If the high frequency magnetic field generated from the third ferromagnetic layer 30 is applied in the direction of the magnetization hard axis of the second ferromagnetic layer 20, it becomes very easy for the magnetization of the second ferromagnetic layer to reverse.

In the magnetic recording element 110, the direction of the magnetization of the second ferromagnetic layer 20 can be controlled by passing an electronic current through the stacked body SB0. Specifically, the direction of the magnetization of the second ferromagnetic layer 20 can be reversed by changing the direction of the flow of the electronic current (polarity). When information is recorded, for example, "0" and "1" are allotted in accordance with the direction of the magnetization of the second ferromagnetic layer 20.

As a specific example of the operation in the magnetic recording element 110, first the "write" operation will now be described.

FIG. 3A to FIG. 3D are schematic views illustrating an operation of the magnetic recording element according to the embodiment.

The drawings illustrate states of the first stacked unit SB1 during the "write" operation in the magnetic recording element 110. In the drawings, the second stacked unit SB2 and the third nonmagnetic layer 30n are omitted.

FIG. 3A illustrates a state where an electronic current 60 has started to be passed from the first ferromagnetic layer 10 toward the second ferromagnetic layer 20. FIG. 3B illustrates a state where passing the electronic current 60 from the first ferromagnetic layer 10 toward the second ferromagnetic layer 20 has been completed (a state where the magnetization is reversed). FIG. 3C illustrates a state where the electronic current 60 has started to be passed from the second ferromagnetic layer 20 toward the first ferromagnetic layer 10. FIG. 3D illustrates a state where passing the electronic current 60 from the second ferromagnetic layer 20 toward the first ferromagnetic layer 10 has been completed (a state where the magnetization is reversed). FIG. 3C and FIG. 3D correspond to the cases where the direction of the electronic current 60 is reversed in the cases illustrated in FIG. 3A and FIG. 3B, respectively.

In the write operation, the electronic current 60 is passed to cross the film surface of the first ferromagnetic layer 10 and the film surface of the second ferromagnetic layer 20 to perform the write operation on the second ferromagnetic layer 20. Herein, the case is described where the magnetoresistive effect via the first nonmagnetic layer 10n is a normal type.

In the magnetoresistive effect of the "normal type," the electric resistance when the magnetizations of magnetic layers on both sides of a nonmagnetic layer are parallel to each other is lower than the electric resistance when they are antiparallel. In the case of the normal type, the electric resistance between the first ferromagnetic layer 10 and the second ferromagnetic layer 20 via the first nonmagnetic layer 10n is lower when the magnetization of the first ferromagnetic layer 10 is parallel to the magnetization of the second ferromagnetic layer 20 than when antiparallel.

As shown in FIG. 3A, an electron having passed through the first ferromagnetic layer 10 having a magnetization 12a in a direction substantially perpendicular to the film surface obtains a spin in the same direction as the magnetization of the first ferromagnetic layer 10. When the electron flows into the second ferromagnetic layer 20, the angular momentum of the spin is transmitted to the second ferromagnetic layer 20 to act on the magnetization 32 of the second ferromagnetic layer 20. That is, what is called a spin-transfer torque works.

Thereby, as shown in FIG. 3B, the magnetization 32 of the second ferromagnetic layer 20 becomes in the same direction as the magnetization 12a of the first ferromagnetic layer 10. This direction is the upward direction in FIG. 3B, for example one direction parallel to the stacking direction SD1. "0", for example, is allotted to the state of the second ferromagnetic layer 20 having the magnetization 32 in this direction (the upward direction in FIG. 3B).

As shown in FIG. 3C, out of the electrons having passed through the first nonmagnetic layer 10n, an electron having a spin in the same direction as the magnetization 12a of the first ferromagnetic layer 10 (the upward direction in FIG. 3C) passes through the first ferromagnetic layer 10. On the other hand, an electron having a spin in the opposite direction to the magnetization 12a of the first ferromagnetic layer 10 (the downward direction in FIG. 3C) is reflected at the interface between the first ferromagnetic layer 10 and the first nonmagnetic layer 10n. The angular momentum of the spin of the reflected electron is transmitted to the second ferromagnetic layer 20 to act on the magnetization 32 of the second ferromagnetic layer 20.

Thereby, as shown in FIG. 3D, the magnetization 32 of the second ferromagnetic layer 20 becomes in the opposite direction to the magnetization 12a of the first ferromagnetic layer 10 (the downward direction in FIG. 3D). That is, a spin-transfer torque works. "1", for example, is allotted to the state of the second ferromagnetic layer 20 having the magnetization 32 in this direction (the downward direction in FIG. 3D). "0" or "1" is appropriately allotted to the different states of the second ferromagnetic layer 20 based on such action. Thereby, "writing" is performed in the magnetic recording element 110.

On the other hand, in the case where the magnetoresistive effect is a "reverse type," the electric resistance between the first ferromagnetic layer 10 and the second ferromagnetic layer 20 via the first nonmagnetic layer 10n is higher when the magnetization of the first ferromagnetic layer 10 is parallel to the magnetization of the second ferromagnetic layer 20 than when antiparallel. The "write" operation in the reverse type is similar to that in the case of the normal type.

Next, the "read" operation will now be described.

The detection of the direction of the magnetization of the second ferromagnetic layer 20 in the magnetic recording element 110 can be performed by, for example, utilizing the magnetoresistive effect. In the magnetoresistive effect, electric resistance changes with the relative direction of the magnetization of each layer. In the case where the magnetoresistive effect is utilized, a sense current is passed between the first ferromagnetic layer 10 and the second ferromagnetic layer 20 to measure the magnetic resistance. The current value of the sense current is smaller than the current value corresponding to the electronic current 60 passed during recording.

FIG. 4A and FIG. 4B are schematic views illustrating an operation of the magnetic recording element according to the embodiment.

The drawings illustrate states of the first stacked unit SB1 during the "read" operation in the magnetic recording element 110. In the drawings, the second stacked unit SB2 and the third nonmagnetic layer 30n are omitted.

FIG. 4A illustrates the case where the direction of the magnetization of the first ferromagnetic layer 10 is the same as the direction of the magnetization of the second ferromagnetic layer 20. FIG. 4B illustrates the case where the direction of the magnetization of the first ferromagnetic layer 10 is antiparallel (opposite) to the direction of the magnetization of the second ferromagnetic layer 20.

As shown in FIG. 4A and FIG. 4B, a sense current 61 is passed through the first stacked unit SB1 to detect the electric resistance.

In the magnetoresistive effect of the normal type, the resistance in the state of FIG. 4A is lower than the resistance in the state of FIG. 4B. In the magnetoresistive effect of the reverse type, the resistance in the state of FIG. 4A is higher than the resistance in the state of FIG. 4B.

By relating "0" and "1" to these states of different resistances, respectively, the record of two value data can be read out. The direction of the sense current 61 may be opposite to the direction illustrated in FIG. 4A and FIG. 4B.

As the first ferromagnetic layer 10 and the second ferromagnetic layer 20, a metal material containing at least one element selected from the group consisting of iron (Fe), cobalt (Co), nickel (Ni), manganese (Mn), and chromium (Cr), for example, is preferably used. In addition, an alloy of the combination of at least one selected from the group mentioned above and at least one element selected from the group consisting of platinum (Pt), palladium (Pd), iridium (Ir), ruthenium (Ru), and rhodium (Rh) may be used.

The characteristics of the first ferromagnetic layer 10 and the second ferromagnetic layer 20 can be adjusted by the composition of the magnetic material contained and heat treatment. Furthermore, as the first ferromagnetic layer 10 and the second ferromagnetic layer 20, an amorphous alloy of rare earth-transition metal such as TbFeCo and GdFeCo may be used. A stacked structure such as Co/Pt, Co/Pd, and Co/Ni may be used as the first ferromagnetic layer 10 and the second ferromagnetic layer 20. Co/Ru, Fe/Au, Ni/Cu, and the like become a perpendicular magnetic film depending on the combination with the underlayer. Co/Ru, Fe/Au, Ni/Cu, and the like can be used as the first ferromagnetic layer 10 and the second ferromagnetic layer 20 by controlling the crystalline orientation direction of the film.

As the third ferromagnetic layer 30, a metal material containing at least one element selected from the group consisting of iron (Fe), cobalt (Co), nickel (Ni), manganese (Mn), and chromium (Cr), for example, is preferably used. In addition, an alloy of the combination of at least one selected from the group mentioned above and at least one element selected from the group consisting of platinum (Pt), palladium (Pd), iridium (Ir), ruthenium (Ru), and rhodium (Rh) may be used.

The characteristics of the third ferromagnetic layer 30 can be adjusted by the composition of the magnetic material contained and heat treatment. Furthermore, as the third ferromagnetic layer 30, Germanium (Ge), Aluminium (Al), Nitrogen (N), Phosphorus (P), Arsenicum (As), Boron (B) or Silicon (Si) may be compounded. A stacked structure such as Co/Pt, Co/Pd, and Co/Ni may be used as the third ferromagnetic layer 30. Co/Ru, Fe/Au, Ni/Cu, and the like can be used as the third ferromagnetic layer 30 by controlling the crystalline orientation direction of the film.

An insulating material functioning as a nonmagnetic tunnel barrier layer may be used as the first nonmagnetic layer 10n. Specifically, for example, an oxide, nitride, or fluoride containing at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used.

As the first nonmagnetic layer 10n, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, and the like may be used. In addition, for example, a nonmagnetic semiconductor ($ZnO_x$, InMn, GaN, GaAs, $TiO_x$, Zn, and Te or these materials doped with a transition metal) and the like may be used as the first nonmagnetic layer 10n.

The thickness of the first nonmagnetic layer 10n is preferably set to a value in a range approximately from 0.2 nanometers (nm) to 2.0 nm. Thereby, for example, an excessive high resistance is suppressed while ensuring the uniformity of the insulating film.

As the second nonmagnetic layer 20n, for example, one of a nonmagnetic tunnel barrier layer and a nonmagnetic metal layer may be used.

An insulating material, for example, is used as the nonmagnetic tunnel barrier layer. Specifically, for example, an oxide, nitride, or fluoride containing at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used as the nonmagnetic tunnel barrier layer. In addition, as the nonmagnetic tunnel barrier layer, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, and the like may be used.

As the nonmagnetic tunnel barrier layer, a nonmagnetic semiconductor ($ZnO_x$, InMn, GaN, GaAs, $TiO_x$, Zn, and Te or these materials doped with a transition metal) and the like may be used.

In the case where a nonmagnetic tunnel barrier layer is used as the second nonmagnetic layer 20n, the thickness of the second nonmagnetic layer 20n is preferably set to a value in a range approximately from 0.2 nm to 2.0 nm.

As the nonmagnetic metal layer used as the second nonmagnetic layer 20n, for example, a nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), and bismuth (Bi) or an alloy containing at least two elements selected from the group mentioned above may be used. The thickness of the second nonmagnetic layer 20n is preferably made not less than 1.5 nm and not more than 20 nm. Thereby, an interlayer coupling does not occur between magnetic layers, and the loss of the spin polarization state of a conduction electron is suppressed when the conduction electron passes through the nonmagnetic metal layer.

As the fourth ferromagnetic layer 40, a metal material containing at least one element selected from the group consisting of iron (Fe), cobalt (Co), nickel (Ni), manganese (Mn), and chromium (Cr) is preferably used. Furthermore, an alloy by the combination of these and at least one element selected from the group consisting of platinum (Pt), palladium (Pd), iridium (Ir), ruthenium (Ru), and rhodium (Rh) may be used.

The characteristics of the fourth ferromagnetic layer 40 can be adjusted by the composition of the magnetic material contained and heat treatment. As the fourth ferromagnetic layer 40, an amorphous alloy of rare earth-transition metal such as TbFeCo and GdFeCo may be used. In addition, as the fourth ferromagnetic layer 40, a stacked structure such as Co/Pt, Co/Pd, and Co/Ni may be used. Co/Ru, Fe/Au, Ni/Cu, and the like become a perpendicular magnetic film depending on the combination with the underlayer. Co/Ru, Fe/Au, Ni/Cu, and the like can be used as the fourth ferromagnetic layer 40 by controlling the crystalline orientation direction of the film.

A nonmagnetic metal layer is used as the third nonmagnetic layer 30n.

As the nonmagnetic metal layer used as the third nonmagnetic layer 30n, at least one nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), bismuth (Bi), iridium (Ir), and osmium (Os) or an alloy containing two or more elements selected from the group mentioned above may be used.

As the third nonmagnetic layer 30n, a material with a long spin diffusion length such as copper (Cu) or a material with a short spin diffusion length such as ruthenium (Ru) may be used. In the case where it is desirable to cancel the effect of spin-polarized electrons being interposed, a material with a short spin diffusion length such as ruthenium (Ru) is preferably used as the third nonmagnetic layer 30n.

As described above, in the magnetic recording element 110, a pair of electrodes are provided in order to pass an electronic current through the stacked body SB0.

A conductive magnetic material or a conductive nonmagnetic material is used as the electrode. Specific examples of the conductive magnetic material include a material similar to the material used as the third ferromagnetic layer 30 and the fourth ferromagnetic layer 40.

Specific examples of the conductive nonmagnetic material include a metal selected from the group consisting of gold (Au), copper (Cu), chromium (Cr), zinc (Zn), gallium (Ga), niobium (Nb), molybdenum (Mo), ruthenium (Ru), palladium (Pd), silver (Ag), hafnium (Hf), tantalum (Ta), tungsten (W), platinum (Pt), bismuth (Bi), and aluminum (Al) or an alloy containing two or more selected from the group mentioned above.

In addition, as the conductive nonmagnetic material used as the electrode, a material such as carbon nanotube, carbon nanowire, and graphene is given.

As the conductive protection film provided for the electrode, an alloy containing at least one element selected from the group consisting of tantalum (Ta), ruthenium (Ru), copper (Cu), gold (Au), silver (Ag), and aluminum (Al) or a material such as graphene may be used. An element selected from the group consisting of copper (Cu) and aluminum (Al) or an alloy containing them is preferably used as the protection film from the viewpoint of being resistant to electromigration and low resistive.

As described above, the shapes of the first stacked unit SB1 and the second stacked unit SB2 when viewed along the Z-axis are arbitrary. For example, the shapes of the first stacked unit SB1 and the second stacked unit SB2 when viewed along the Z-axis (the shape cut along a plane parallel to the film surface) may be a circle, ellipse, flat circle, and polygon having three or more corners such as a tetragon and hexagon.

The shapes of the first stacked unit SB1 and the second stacked unit SB2 when cut along a plane parallel to the Z-axis are arbitrary. The shapes of the first stacked unit SB1 and the second stacked unit SB2 when cut along the plane parallel to the Z-axis (the shape cut along a plane perpendicular to the film surface) may have, for example, a tapered shape or an inverse tapered shape.

Various examples of the configuration of the magnetic recording element according to the embodiment will now be described as a second to a sixth embodiment. In the following, not-described configuration, the material of the components, and the like are similar to the structure and the material of the components described in regard to the magnetic recording element 110.

Second Embodiment

FIG. 5A and FIG. 5B are schematic cross-sectional views illustrating the configurations of magnetic recording elements according to a second embodiment.

As shown in FIG. 5A and FIG. 5B, in magnetic recording elements 110a and 110b according to the embodiment, the second ferromagnetic layer 20, the first nonmagnetic layer 10n, the first ferromagnetic layer 10, the third nonmagnetic layer 30n, the fourth ferromagnetic layer 40, the second nonmagnetic layer 20n, and the third ferromagnetic layer 30 are stacked in this order.

That is, the first ferromagnetic layer 10 is disposed between the second ferromagnetic layer 20 and the fourth ferromagnetic layer 40, the fourth ferromagnetic layer 40 is disposed between the first ferromagnetic layer 10 and the third ferromagnetic layer 30, and the third nonmagnetic layer 30n is disposed between the first ferromagnetic layer 10 and the fourth ferromagnetic layer 40.

In the magnetic recording elements 110a and 110b, the direction of the perpendicular oblique shadow component of the magnetization fixed in the first direction (the magnetization of the first ferromagnetic layer 10) is opposite to the direction of the perpendicular oblique shadow component of the magnetization fixed in the second direction (the magnetization of the fourth ferromagnetic layer 40). Furthermore, the direction of the rotating magnetic field generated in the third ferromagnetic layer 30 and the direction in which the magnetization of the second ferromagnetic layer 20 precesses coincide with each other. The rotating magnetic field generated in the third ferromagnetic layer 30 acts more effectively on the second ferromagnetic layer 20. This can assist the magnetization reversal of the second ferromagnetic layer 20 more efficiently. Thereby, the current necessary for writing to the second ferromagnetic layer 20 can be more reduced.

FIG. 6A and FIG. 6B are schematic cross-sectional views illustrating the configurations of magnetic recording elements according to the second embodiment.

As shown in FIG. 6A and FIG. 6B, in magnetic recording elements 110c and 110d according to the embodiment, the direction of the magnetization of the first ferromagnetic layer and the direction of the magnetization of the fourth ferromagnetic layer 40 are oblique to the film surface. Also in this case, the direction of the perpendicular oblique shadow component of the magnetization fixed in the first direction (the magnetization of the first ferromagnetic layer 10) is opposite to the direction of the perpendicular oblique shadow component of the magnetization fixed in the second direction (the magnetization of the fourth ferromagnetic layer 40).

In the case where the direction of the perpendicular oblique shadow component of the magnetization fixed in the first direction is opposite to the direction of the perpendicular oblique shadow component of the magnetization fixed in the second direction, the stray magnetic field applied in the direction perpendicular to the film surface in the position of the second ferromagnetic layer 20 can be reduced. That is, the stray magnetic field applied in the direction perpendicular to the film surface in the position of the second ferromagnetic layer 20 can be cancelled. On the other hand, the stray magnetic field applied in the direction perpendicular to the film surface in the position of the third ferromagnetic layer 30 can be caused to remain and act.

Thereby, the direction of the rotating magnetic field generated in the third ferromagnetic layer 30 coincides with the direction in which the magnetization of the second ferromagnetic layer 20 precesses. The rotating magnetic field generated in the third ferromagnetic layer 30 can assist the magnetization reversal of the second ferromagnetic layer 20 efficiently. As a result, the current necessary for recording (writing) information to the second ferromagnetic layer 20 can be reduced.

In the magnetic recording elements 110a to 110d, the first ferromagnetic layer 10 and the fourth ferromagnetic layer 40 may be coupled antiferromagnetically via the third nonmagnetic layer 30n. Such a structure in which mutual magnetization directions are coupled antiferromagnetically via a nonmagnetic layer to become antiparallel is called a synthetic anti-ferromagnet (SAF) structure. In this example, the stacked structure of "a first magnetic layer (e.g. the first ferromagnetic layer 10)/a nonmagnetic layer (e.g. the third nonmagnetic layer 30n)/a second magnetic layer (e.g. the fourth ferromagnetic layer 40)" corresponds to the SAF structure.

Using the SAF structure can enhance the mutual magnetization fixing strength and increase resistance to external magnetic fields and thermal stability. In the structure, the stray magnetic field applied in the direction perpendicular to the film surface in the position of the magnetic recording layer (e.g. the second ferromagnetic layer 20) can be made almost zero.

A metal material such as ruthenium (Ru), iridium (Ir), and osmium (Os) is used as the nonmagnetic layer (intermediate layer) of the SAF structure. The thickness of the nonmagnetic layer is set not more than 3 nm. Thereby, a sufficiently strong antiferromagnetic coupling is obtained via the nonmagnetic layer.

That is, the third nonmagnetic layer 30n preferably contains a metal selected from the group consisting of ruthenium (Ru), osmium (Os), and iridium (Ir) or an alloy containing at least two selected from the group, and the thickness of the third nonmagnetic layer 30n is preferably not more than 3 nm.

The dimensions (width, thickness, etc.) of the layers included in the magnetic recording element according to the embodiment are found through an electron microscope photographic image or the like, for example.

Third Embodiment

Figures 7A, 7B:
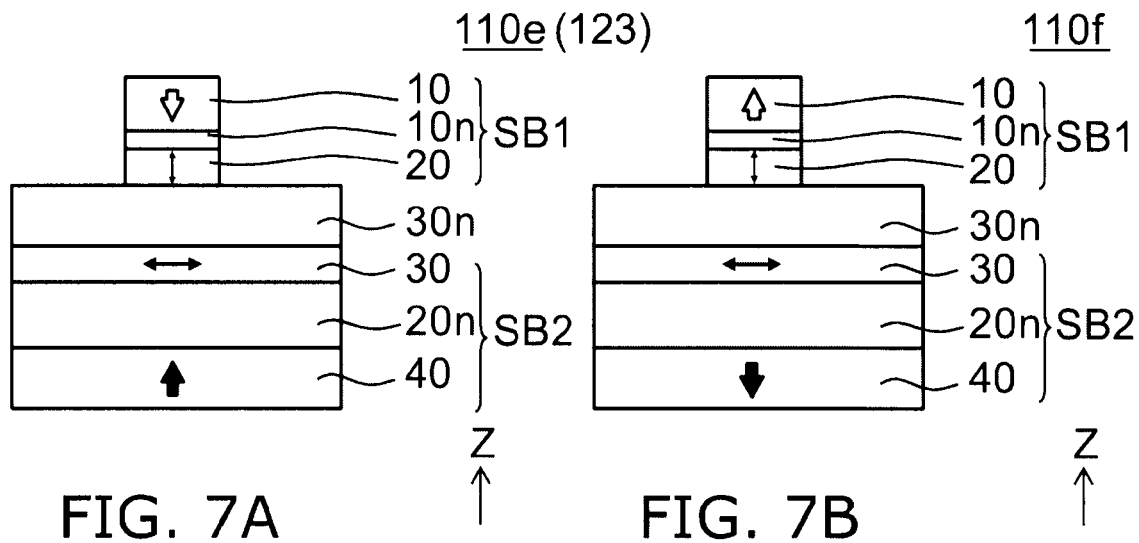
FIG. 7A and FIG. 7B are schematic cross-sectional views showing magnetic recording elements according to a third embodiment.

FIG. 7A and FIG. 7B are schematic cross-sectional views illustrating the configurations of magnetic recording elements according to a third embodiment.

As shown in FIG. 7A and FIG. 7B, in magnetic recording elements 110e and 110f according to the embodiment, the first ferromagnetic layer 10, the first nonmagnetic layer 10n, the second ferromagnetic layer 20, the third nonmagnetic layer 30n, the third ferromagnetic layer 30, the second nonmagnetic layer 20n, and the fourth ferromagnetic layer 40 are stacked in this order. Also in this case, the directions of the magnetization of the first ferromagnetic layer 10 and the magnetization of the fourth ferromagnetic layer 40 may be oblique to the film surface.

In this example, the second ferromagnetic layer 20 is disposed between the first ferromagnetic layer 10 and the third ferromagnetic layer 30, the third ferromagnetic layer 30 is disposed between the second ferromagnetic layer 20 and the fourth ferromagnetic layer 40, and the third nonmagnetic layer 30n is disposed between the second ferromagnetic layer 20 and the third ferromagnetic layer 30.

In the magnetic recording elements 110e and 110f, the direction of the perpendicular oblique shadow component of the magnetization fixed in the first direction and the direction of the perpendicular oblique shadow component of the magnetization fixed in the second direction are opposite to each other. Thereby, the direction of the rotating magnetic field generated in the third ferromagnetic layer 30 and the direction in which the magnetization of the second ferromagnetic layer 20 precesses can be caused to coincide with each other.

In the magnetic recording elements 110e and 110f, the distance between the second ferromagnetic layer 20 and the third ferromagnetic layer 30 is shorter than that in the magnetic recording elements 110a and 110b. Thereby, the rotating magnetic field generated in the third ferromagnetic layer 30 can act more on the second ferromagnetic layer 20 and assist the magnetization reversal of the second ferromagnetic layer 20 more efficiently. Thereby, the current necessary for writing to the second ferromagnetic layer can be more reduced.

In the magnetic recording elements 110e and 110f, if the spin information is kept in the third nonmagnetic layer 30n, the third ferromagnetic layer 30 is affected by the spin-transfer torque from the second ferromagnetic layer 20. This may cause a decrease in the controllability of the magnetization rotation of the third ferromagnetic layer 30.

At this time, as the third nonmagnetic layer 30n, a film with a short spin diffusion length such as, for example, ruthenium (Ru) (a material having the function of spin cancel) or a layer having a structure with a short spin diffusion length is preferably used. This can suppress the decrease in the controllability of the magnetization rotation of the third ferromagnetic layer 30.

That is, the magnitude of the spin-transfer torque for the magnetization of the third ferromagnetic layer 30 to precess is determined by the spin polarization in the fourth ferromagnetic layer 40. In this configuration, the magnetization of the third ferromagnetic layer 30 can be independently controlled without being affected by the spin of other electrons (spin-transfer torque).

As the material of the third nonmagnetic layer 30n providing such a spin cancel effect, a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy containing two or more selected from the group can be given.

The thickness of the third nonmagnetic layer 30n is preferably set to a value that does not cause an interlayer magnetic coupling between the second ferromagnetic layer 20 and the third ferromagnetic layer 30. Specifically, the thickness of the third nonmagnetic layer 30n is preferably set not less than 1.4 nm.

If the thickness of the third nonmagnetic layer 30n is not less than 1.4 nm, the second ferromagnetic layer 20 and the third ferromagnetic layer 30 are not interlayer-coupled, and the spin polarization degree can be cancelled in the third nonmagnetic layer 30n when conduction electrons pass through the interior and interface of the third nonmagnetic layer 30n. Furthermore, the third nonmagnetic layer 30n can prevent the precession of the third ferromagnetic layer 30 from changing due to the direction of the magnetization of the second ferromagnetic layer 20.

On the other hand, if the thickness of the third nonmagnetic layer 30n exceeds 20 nm, the pillar formation of a multiple-layer film is difficult. Furthermore, the strength of the rotating magnetic field generated from the third ferromagnetic layer 30 decreases in the position of the second ferromagnetic layer 20. Therefore, the thickness of the third nonmagnetic layer 30n is preferably set not more than 20 nm.

As the third nonmagnetic layer 30n, a stacked film may be used as well as the single-layer film described above. The stacked film may have, for example, a stacked configuration of the following layers: a layer containing a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy containing two or more selected from the group; and a copper (Cu) layer stacked at least on one side of the layer.

In addition, the stacked film used as the third nonmagnetic layer 30n may have, for example, a stacked configuration including the following layers: a first layer containing a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy containing two or more selected from the group; and a second layer stacked at least on one side of the first layer and containing an oxide containing at least one element selected from the group consisting of aluminum (Al), magnesium (Mg), titanium (Ti), iron (Fe), cobalt (Co), nickel (Ni), vanadium (V), chromium (Cr), tantalum (Ta), tungsten (W), and ruthenium (Ru).

Fourth Embodiment

Figures 8A, 8B:
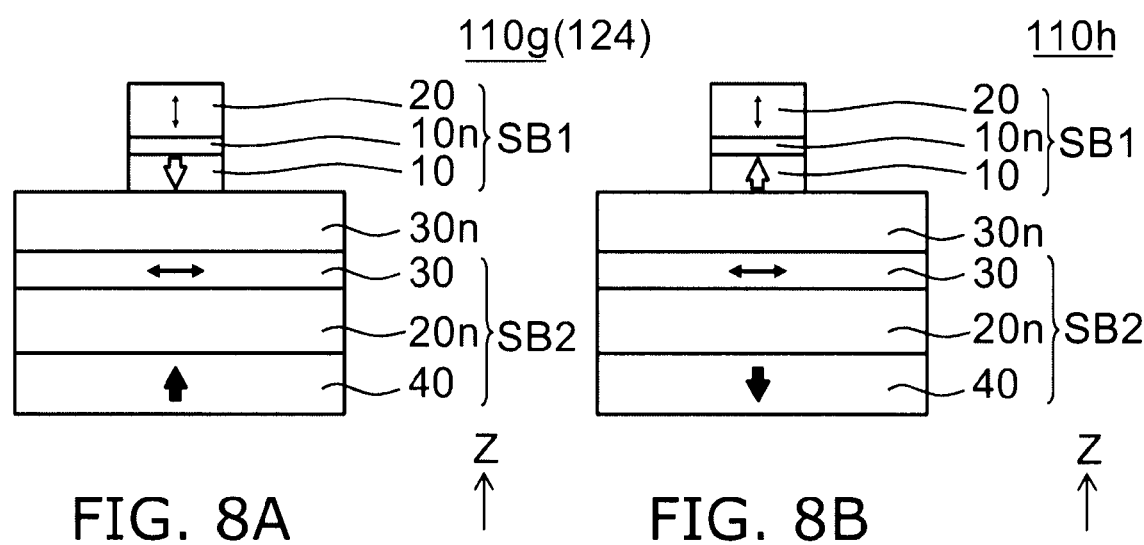
FIG. 8A and FIG. 8B are schematic cross-sectional views showing magnetic recording elements according to a fourth embodiment.

FIG. 8A and FIG. 8B are schematic cross-sectional views illustrating the configurations of magnetic recording elements according to a fourth embodiment.

As shown in FIG. 8A and FIG. 8B, in magnetic recording elements 110g and 110h according to the embodiment, the second ferromagnetic layer 20, the first nonmagnetic layer 10n, the first ferromagnetic layer 10, the third nonmagnetic layer 30n, the third ferromagnetic layer 30, the second nonmagnetic layer 20n, and the fourth ferromagnetic layer 40 are stacked in this order. Also in this case, the directions of the magnetization of the first ferromagnetic layer 10 and the magnetization of the fourth ferromagnetic layer 40 may be oblique to the film surface.

In this example, the first ferromagnetic layer 10 is disposed between the second ferromagnetic layer 20 and the third ferromagnetic layer 30, the third ferromagnetic layer 30 is disposed between the first ferromagnetic layer 10 and the fourth ferromagnetic layer 40, and the third nonmagnetic layer 30n is disposed between the first ferromagnetic layer 10 and the third ferromagnetic layer 30.

In the magnetic recording elements 110g and 110h, the direction of the perpendicular oblique shadow component of the magnetization fixed in the first direction and the direction of the perpendicular oblique shadow component of the magnetization fixed in the second direction are opposite to each other. By applying a magnetic field in the direction opposite to the direction of the magnetization of the fourth ferromagnetic layer 40, the direction of the rotating magnetic field generated in the third ferromagnetic layer 30 and the direction in which the magnetization of the second ferromagnetic layer 20 precesses can be caused to coincide with each other.

In the magnetic recording elements 110g and 110h, the distance between the second ferromagnetic layer 20 and the third ferromagnetic layer 30 is shorter than that in the magnetic recording elements 110a and 110b. Thus, characteristics similar to the characteristics described in regard to the magnetic recording elements 110e and 110f are obtained. Thereby, the current necessary for writing to the second ferromagnetic layer 20 can be more reduced.

In the magnetic recording elements 110g and 110h, the direction of the spin polarization of the electron injected into the third ferromagnetic layer 30 is the same as the direction of the spin polarization in the fourth ferromagnetic layer 40 and the direction of the spin polarization in the first ferromagnetic layer 10. Thereby, for example, the efficiency of the generation of the rotating magnetic field generated in the third ferromagnetic layer 30 improves.

As the third nonmagnetic layer 30n and the second nonmagnetic layer 20n, a metal conductor, insulator, or semiconductor may be used. Layers based on different materials may be used as the third nonmagnetic layer 30n and the second nonmagnetic layer 20n.

In the case where an insulator or a semiconductor is used as the third nonmagnetic layer 30n, the resistance value increases. Therefore, in this case, a metal conductor is preferably used as the second nonmagnetic layer 20n. As the metal conductor, copper (Cu), aluminum (Al), silver (Ag), gold (Au), and the like are preferably used.

Fifth Embodiment

Figures 9A, 9B:
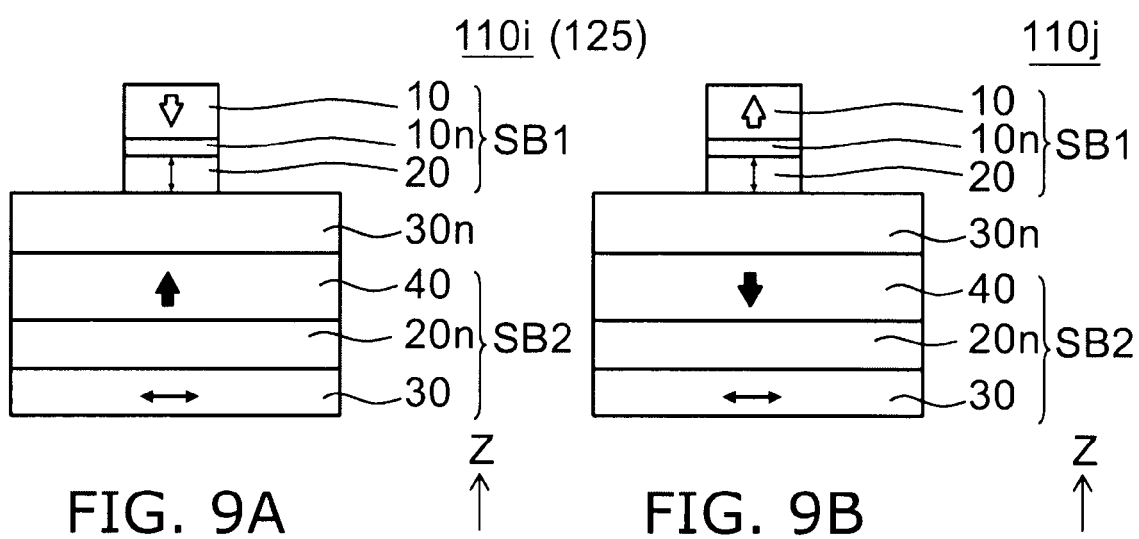
FIG. 9A and FIG. 9B are schematic cross-sectional views showing magnetic recording elements according to a fifth embodiment.

FIG. 9A and FIG. 9B are schematic cross-sectional views illustrating the configurations of magnetic recording elements according to a fifth embodiment.

As shown in FIG. 9A and FIG. 9B, in magnetic recording elements 110i and 110j according to the embodiment, the first ferromagnetic layer 10, the first nonmagnetic layer 10n, the second ferromagnetic layer 20, the third nonmagnetic layer 30n, the fourth ferromagnetic layer 40, the second nonmagnetic layer 20n, and the third ferromagnetic layer 30 are stacked in this order. Also in this case, the directions of the magnetization of the first ferromagnetic layer 10 and the magnetization of the fourth ferromagnetic layer 40 may be oblique to the film surface.

In this example, the second ferromagnetic layer 20 is disposed between the first ferromagnetic layer 10 and the fourth ferromagnetic layer 40, the fourth ferromagnetic layer 40 is disposed between the second ferromagnetic layer 20 and the third ferromagnetic layer 30, and the third nonmagnetic layer 30n is disposed between the second ferromagnetic layer 20 and the fourth ferromagnetic layer 40.

In the magnetic recording elements 110i and 110j, the direction of the perpendicular oblique shadow component of the magnetization fixed in the first direction is opposite to the direction of the perpendicular oblique shadow component of the magnetization fixed in the second direction. By applying a magnetic field in the direction opposite to the direction of the magnetization of the fourth ferromagnetic layer 40, the direction of the rotating magnetic field generated in the third ferromagnetic layer 30 and the direction in which the magnetization of the second ferromagnetic layer 20 precesses can be caused to coincide with each other.

In the magnetic recording elements 110i and 110j, the distance between the second ferromagnetic layer 20 and the third ferromagnetic layer 30 is shorter than that in the magnetic recording elements 110a and 110b. Thus, characteristics similar to the characteristics described in regard to the magnetic recording elements 110e and 110f are obtained. Thereby, the current necessary for writing to the second ferromagnetic layer 20 can be more reduced.

In the magnetic recording elements 110i and 110j, the direction of the spin polarization of the electron injected into the third ferromagnetic layer 30 is the same as the direction of the spin polarization in the fourth ferromagnetic layer 40 and the direction of the spin polarization in the first ferromagnetic layer 10. Thereby, characteristics similar to the characteristics described in regard to the magnetic recording elements 110g and 110h are obtained.

In the magnetic recording elements 110i and 110j, a material similar to the material described in regard to the magnetic recording elements 110g and 110h may be used as the third nonmagnetic layer 30n and the second nonmagnetic layer 20n.

Sixth Embodiment

FIG. 10A and FIG. 10B are schematic cross-sectional views illustrating the configurations of magnetic recording elements according to a sixth embodiment.

As shown in FIG. 10A and FIG. 10B, in magnetic recording elements 110k and 110l according to the embodiment, a magnetic shield 51 opposed to the side surface of the first stacked unit SB1 is provided. In the magnetic recording element 110l, the magnetic shield 51 is further opposed to the side surface of the second stacked unit SB2 and the side surface of the third nonmagnetic layer 30n.

That is, the magnetic recording elements 110k and 110l further include the magnetic shield 51 opposed to at least part of the side surface of the stacked body SB0. The magnetic shield 51 covers the above-mentioned at least part of the side surface of the stacked body SB0.

In addition, the magnetic recording elements 110k and 110l further include a protection layer 52 provided between the above-mentioned at least part of the side surface of the stacked body SB0 and the magnetic shield 51.

In the magnetic recording element 110k, the magnetic shield 51 covers the side surface of the first stacked unit SB1. In the magnetic recording element 110l, the magnetic shield 51 covers the side surface of the first stacked unit SB1, the side surface of the second stacked unit SB2, and the side surface of the third nonmagnetic layer 30n.

For example, the side surface of the first stacked unit SB1 and the side surface of the second stacked unit SB2 are covered with the magnetic shield 51 such as a permalloy (Py) via a protection layer such as, for example, SiN or $Al_2O_3$.

Thereby, in the case where a plurality of magnetic recording elements are arranged, the possibility is decreased that the stray magnetic field from an adjacent magnetic recording element affects the operation of the first stacked unit SB1 and the second stacked unit SB2. Thereby, the current injection amount necessary to generate the rotating magnetic field can be reduced. Furthermore, the possibility can be decreased that the stray magnetic field from the first stacked unit SB1 and the second stacked unit SB2 acts on an adjacent magnetic recording element. As a consequence, the plurality of magnetic recording elements can be closely arranged to improve the integration degree.

As the protection layer 52, an oxide, nitride, or fluoride containing at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used.

As the magnetic shield 51, an element selected from the group consisting of iron (Fe), cobalt (Co), nickel (Ni), manganese (Mn), and chromium (Cr) or an alloy containing two or more selected from the group may be used.

In addition, as the magnetic shield 51, an alloy by the combination of at least one element selected from the group consisting of iron (Fe), cobalt (Co), nickel (Ni), manganese (Mn), and chromium (Cr) and at least one element selected from the group consisting of platinum (Pt), palladium (Pd), iridium (Ir), ruthenium (Ru), and rhodium (Rh) may be used.

The characteristics of the magnetic shield 51 can be adjusted by the composition of the magnetic material contained in the magnetic shield 51 and heat treatment. Furthermore, as the magnetic shield 51, an amorphous alloy of rare earth-transition metal such as TbFeCo and GdFeCo may be used. Furthermore, a stacked structure such as Co/Pt, Co/Pd, and Co/Ni may be used as the magnetic shield 51.

The magnetic shield 51 (and the protection layer 52) mentioned above may be provided also in the magnetic recording elements 110 and 110a to 110j according to the embodiment and magnetic recording elements modified based on them.

A method for manufacturing a magnetic recording element according to the embodiment will now be described. The following manufacturing method is applied to the magnetic recording elements 110 and 110a to 110j according to the embodiment, magnetic recording elements modified based on them, and the like.

In the following description, "material A\material B" means that material B is stacked on material A.

A lower electrode (not shown) is formed on a wafer, and then the wafer is placed in an ultrahigh vacuum sputter apparatus. On the lower electrode, a Ta\Ru layer (a contact layer for contact with an electrode, also functioning as a stopper layer), an FePt\CoFeB\Cu\Py layer (the magnetic field generation source), and Ta (a stopper layer) are stacked in this order. Thereby, a workpiece is formed.

Next, an EB (electron beam) resist is applied to perform EB exposure to form a resist mask with a diameter of 100 nm. Ion milling is performed to remove the portions not covered with the resist of the workpiece until the Ta layer of a stopper layer becomes exposed.

After that, a $SiO_2$ film that forms an embedded insulating layer is film-formed, and then the resist is lifted off.

Subsequently, Ta\Cu (the third nonmagnetic layer 30n), a CoFeB\FePt layer (the first ferromagnetic layer 10), MgO (the first nonmagnetic layer 10n), an FePd\CoFeB layer (the second ferromagnetic layer 20), and a layer of Ta (a contact layer for contact with an electrode) thereon are stacked in this order. Here, the strength of the magnetic anisotropy in the film surface perpendicular direction of the FePd\CoFeB layer and the CoFeB\FePt layer can be adjusted by annealing in a magnetic field as well.

Next, an EB (electron beam) resist is applied to perform EB exposure to form a resist mask with a diameter of 20 nm. Ion milling is performed to remove the portions not covered with the resist of the workpiece until the Ta layer of a stopper layer becomes exposed. Next, a $SiO_2$ film that forms an embedded insulating layer is film-formed, then planarization is performed by CMP (chemical mechanical polishing) or the like, and then RIE (reactive ion etching) or the like is performed to etch the entire surface to expose the contact layer for contact with an electrode.

Further, a resist is applied to the entire surface, and a stepper exposure apparatus is used to perform patterning on the resist so that the opening of the resist may correspond to the position of an upper electrode. A Cu film is formed so as to fill the opening corresponding to the upper electrode, and the resist is removed. Thereby, the upper electrode is formed. An interconnection (not shown) electrically connected to the upper electrode is provided.

A method for manufacturing the magnetic recording element 110k will now be described.

Similarly to the manufacturing method described above, on the lower electrode, a Ta\Ru layer (a contact layer for contact with an electrode, also functioning as a stopper layer), the magnetic field generation source, and Ta (a stopper layer) are stacked in this order, and the workpiece is processed to a size of 100 nm in diameter. Then, the third nonmagnetic layer 30n, the first ferromagnetic layer 10, the first nonmagnetic layer 10n, the second ferromagnetic layer 20, and the contact layer for contact with an electrode are stacked in this order, and the workpiece is processed to a size of 20 nm in diameter. Then, after a SiN layer that forms the protection layer 52 is formed, a Py layer that forms the magnetic shield 51 is formed. Etchback is performed to leave the Py layer on the side wall of the stacked body SB0. Further, a $SiO_2$ film that forms an embedded insulating layer is formed and processed, and an upper electrode is formed. Thereby, the magnetic recording element 110k is fabricated.

In the above, by changing the order of the formation of the SiN layer that forms the protection layer 52 and the Py layer that forms the magnetic shield 51, the magnetic recording element 110l can be fabricated.

As described above, in the magnetic recording elements 110 and 110a to 110l, the second outer edge SBP2 of the second stacked unit SB2 is located outside the first outer edge SBP1 of the first stacked unit SB1. That is, the film cross-sectional area of the second stacked unit SB2 is larger than the film cross-sectional area of the first stacked unit SB1. Hereinbelow, for the sake of simple description, the case is described where the planar shape of the first stacked unit SB1 and the planar shape of the second stacked unit SB2 are substantially circular, as illustrated in FIG. 1B and FIG. 1C. The diameter of the second stacked unit SB2 (a second diameter D2) is larger than the diameter of the first stacked unit SB1 (a first diameter D1).

Here, in the case where the side surface of the first stacked unit SB1 is oblique to the Z-axis (in the case of a tapered shape), it is assumed that the first diameter D1 of the first stacked unit SB1 is the average value of the diameter of the first ferromagnetic layer 10 and the diameter of the second ferromagnetic layer 20. Similarly, in the case where the side surface of the second stacked unit SB2 is oblique to the Z-axis (in the case of a tapered shape), it is assumed that the second diameter D2 of the second stacked unit SB2 is the average value of the diameter of the third ferromagnetic layer 30 and the diameter of the fourth ferromagnetic layer 40.

For example, in the example of the manufacturing method mentioned above, the second diameter D2 is 100 nm and the first diameter D1 is 20 nm.

Since the second diameter D2 of the second stacked unit SB2 (the magnetic field generation source) is larger than the first diameter D1 of the first stacked unit SB1 (the magnetic recording unit), the magnetic recording unit is placed on a region where the magnetization angle is uniform when the third ferromagnetic layer 30 of the magnetic field generation source is in equilibrium. Therefore, for the magnetic recording unit, the oscillation of the magnetic field generation source starts from a state where the initial angle is uniform. Thereby, the time leading to stable oscillation is reduced to enable a quick magnetization reversal. That is, the magnetization reversal during writing occurs more quickly.

Hereinbelow, characteristics of the magnetic recording element according to the embodiment are described.

FIG. 11 is a graph illustrating characteristics of the magnetic recording element.

FIG. 11 illustrates the result of a simulation using micromagnetics in regard to characteristics of the magnetic field generation source of the magnetic recording element. The horizontal axis of FIG. 11 is time t (nanoseconds: ns). The vertical axis is the magnetization Mx of the ferromagnetic layer 30 in the film in-plane direction (e.g. the X-axis direction).

In the simulation, the magnetic recording unit was made in a pillar shape with a diameter of 20 nm. That is, the first diameter D1=20 nm. As the fourth ferromagnetic layer 40 (thickness: 10 nm), a perpendicular magnetic film of Ms (magnetization)=1000 emu/cc and Ku=8 Merg/$cm^3$ was used. As the second nonmagnetic layer 20n, a Cu layer (thickness: 2 nm) was used. As the third ferromagnetic layer 30 (thickness: 2 nm), an in-plane magnetic film of Ms (magnetization)=1700 emu/cc and Ku=5000 erg/$cm^3$ was used. The spin polarization degree was made 0.4 and the dumping constant was made 0.01.

At this time, the strength of the stray magnetic field generated in the fourth ferromagnetic layer 40 and applied to the third ferromagnetic layer 30 has an in-plane distribution. Therefore, the magnetization of the third ferromagnetic layer 30 is subjected to a magnetic field in the in-plane direction to be inclined in the outer edge portion. Consequently, the magnetic field generation source has a distribution in the magnetization direction in the behavior at the initial stage of the oscillation, and some amount of time is therefore needed to lead to stable oscillation.

FIG. 11 illustrates the behavior at the initial stage of the oscillation in the case where the size of the third ferromagnetic layer 30 (e.g. the second diameter D2) is 100 nm and the case where it is 20 nm. In both cases, the size of the first stacked unit SB1 (e.g. the first diameter D1) is 20 nm.

As can be seen from FIG. 11, in the case where the size of the third ferromagnetic layer 30 is 100 nm, the time t leading to stable oscillation is shortened as compared to the case of 20 nm. It is considered that this is because, in the case where the size of the third ferromagnetic layer 30 is 100 nm, the first stacked unit SB1 is located in a region where the distribution of the stray magnetic field from the fourth ferromagnetic layer 40 is uniform.

A situation is thus created where the magnetization of the third ferromagnetic layer 30 precesses in a region where the distribution of the stray magnetic field from the fourth ferromagnetic layer 40 is uniform. Thereby, the time leading to stable oscillation can be shortened.

For example, when a current is passed in a configuration in which the magnetic recording unit is provided in a region where the distribution of the stray magnetic field from the fourth ferromagnetic layer 40 is uniform, the current flows concentratedly through the surface in contact with the magnetic recording unit. As a result, the region where the magnetization of the third ferromagnetic layer 30 precesses is limited to within the region where the distribution of the stray magnetic field from the fourth ferromagnetic layer is uniform. Therefore, the oscillation of the third ferromagnetic layer 30 is shortened. Thereby, the magnetization reversal of the magnetic recording unit can be assisted more effectively.

Thus, by placing the magnetic recording unit in a position where the strength of the stray magnetic field generated from the fourth ferromagnetic layer 40 is uniform (in other words, a region where the inclination of the magnetization of the third ferromagnetic layer 30 is uniform), the magnetization reversal of the magnetic recording unit can be made quick.

Figure 12A:
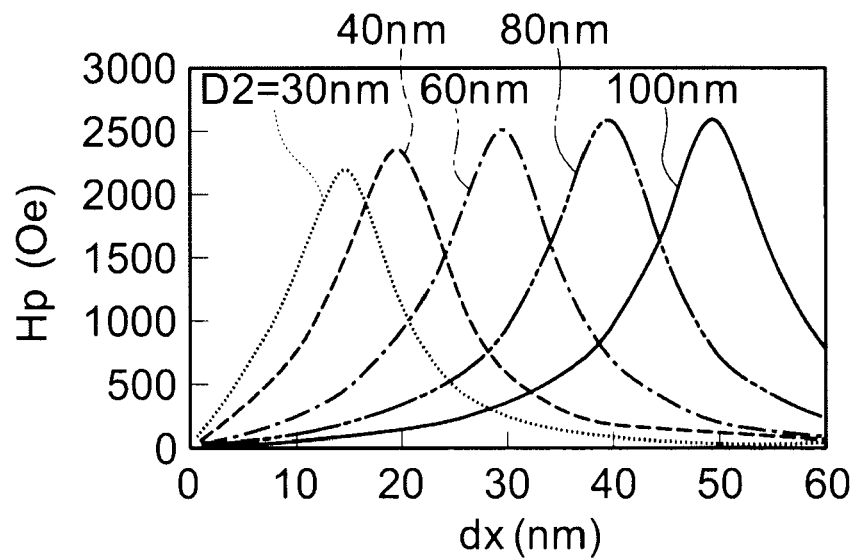
FIG. 12A and FIG. 12B are graphs showing characteristics of the magnetic recording element.
Figure 12B:
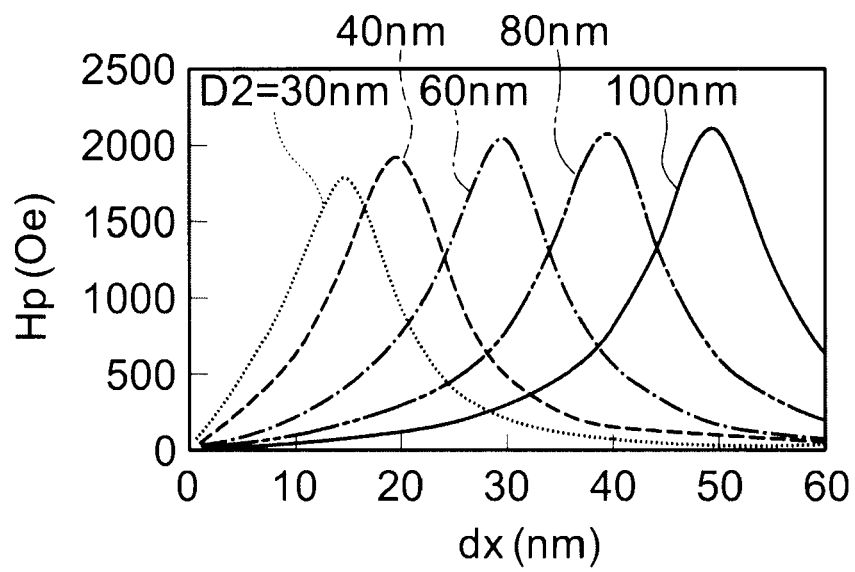

FIG. 12A and FIG. 12B are graphs illustrating characteristics of the magnetic recording element. The drawings illustrate the result of simulations of the distribution of the stray magnetic field that inclines the magnetization of the third ferromagnetic layer 30 toward the in-plane direction. The horizontal axis of the drawings is a distance dx from the center in the X-Y plane of the stacked body SB0. The distance dx is a distance from the center in the X-Y plane of the stacked body SB0, for example along the X-axis direction, as shown in FIG. 1B. The vertical axis is a magnetic field strength Hp in the in-plane direction.

In the simulations, the diameter of the magnetic field generation source (e.g. the second diameter D2) was changed as a parameter. As the fourth ferromagnetic layer 40 (thickness: 10 nm), a perpendicular magnetic film of Ku=8 Merg/cm$^3$ was used. The Ms of the fourth ferromagnetic layer 40 was changed as a parameter in a range of 800 to 1700 emu/cc. As the second nonmagnetic layer 20n, a Cu layer (thickness: 2 nm) was used. As the third ferromagnetic layer 30 (thickness: 2 nm), an in-plane magnetic film of Ms=800 emu/cc and Ku=5000 erg/cm$^3$ was used.

As shown in FIG. 12A and FIG. 12B, as the diameter of the magnetization field generation source (the second diameter D2) increases, the distance dx at which the magnetic field strength Hp in the in-plane direction reaches a peak increases.

The position where the magnetic field strength Hp in the in-plane direction becomes half the peak value has been observed as a standard of the region where the inclination of the magnetization of the third ferromagnetic layer 30 is almost uniform.

Figure 13:
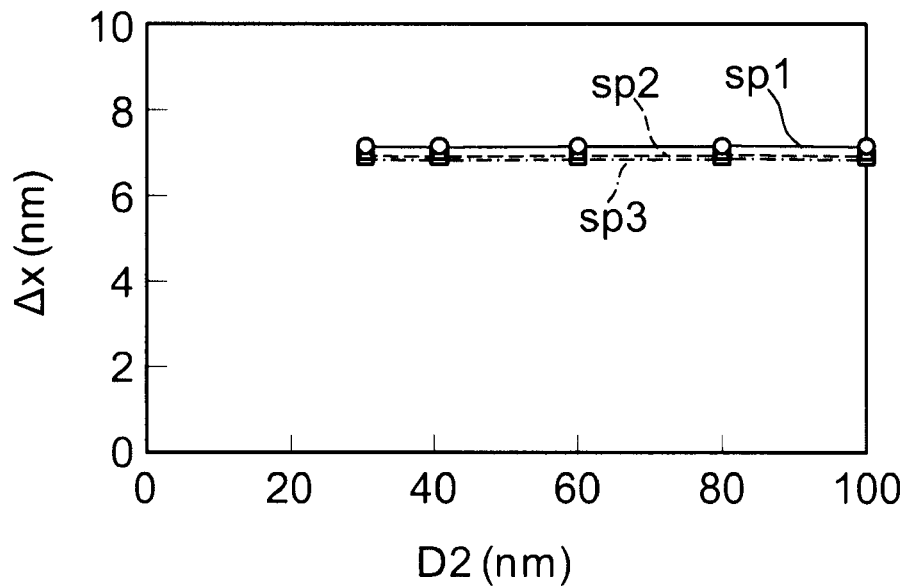
FIG. 13 is a graph showing characteristics of the magnetic recording element.

FIG. 13 is a graph illustrating characteristics of the magnetic recording element.

FIG. 13 illustrates a distance $\Delta x$ from the outer edge (outer periphery) of the position where the magnetic field strength Hp in the in-plane direction becomes half when the diameter of the third ferromagnetic layer 30 (e.g. the second diameter D2) is changed. The horizontal axis is the second diameter D2. The vertical axis is the distance $\Delta x$.

In a condition sp1 to a condition sp3 illustrated in FIG. 13, the thickness of the fourth ferromagnetic layer 40 was set to 10 nm. The condition sp1, the condition sp2, and the condition sp3 correspond to the cases where the Ms of the ferromagnetic layer 40 is 800 emu/cc, 1000 emu/cc, and 1700 emu/cc, respectively.

As can be seen from FIG. 13, it has been found out that the magnetic field strength Hp in the in-plane direction becomes half the peak value at the position of a distance $\Delta x$ of about 7 nm, irrespective of the magnitude of the Ms of the fourth ferromagnetic layer 40.

That is, the magnetic field strength Hp in the in-plane direction becomes half at the position of 7 nm outward from the outer edge of the fourth ferromagnetic layer 40. Furthermore, also in the cases where the distance is 200 nm and 400 nm, it has been found out that the magnetic field strength Hp in the in-plane direction becomes half at the position of 7 nm outward from the outer edge.

These characteristics have been found out for the first time by the investigation mentioned above of the inventors.

From this, as shown in FIG. 1B and FIG. 1C, the outer edge of the fourth ferromagnetic layer 40 (e.g. the second outer edge SBP2 of the second stacked unit SB2) when viewed along the Z-axis is preferably located outside the first outer edge SBP1 of the first stacked unit SB1 when viewed along the Z-axis, and the distance Dd between the outer edge of the fourth ferromagnetic layer 40 (e.g. the second outer edge SBP2) and the first outer edge SBP1 is preferably set not less than 7 nm.

That is, in the embodiment, the distance Dd between the portion outside the first outer edge SBP1 of the first stacked unit SB1 out of the outer edge of the fourth ferromagnetic layer 40 (e.g. the second outer edge SBP2 of the second stacked unit SB2) when viewed along the Z-axis and the first outer edge SBP1 of the first stacked unit SB1 when viewed along the Z-axis is preferably not less than 7 nm. The distance Dd between a position of the portion of the outer edge of the fourth ferromagnetic layer 40 projected onto the X-Y plane and a position of the first outer edge SBP1 of the first stacked unit SB1 projected onto the X-Y plane is not less than 7 nm. The shortest distance between the outer edge of the fourth ferromagnetic layer 40 and the outer edge of the first stacked unit SB1 is 7 nm. The shortest distance between a position of the outer edge of the fourth ferromagnetic layer 40 projected onto the X-Y plane and a position of the outer edge of the first stacked unit SBP1 projected onto the plane is 7 nm.

Furthermore, a simulation has been carried out to find the distance $\Delta x$ from the outer edge of the position where the magnetic field strength Hp in the in-plane direction becomes half the peak value when the Ms of the fourth ferromagnetic layer 40 is set to 1000 emu/cc and the thickness of the fourth ferromagnetic layer 40 is changed in a range of 10 nm to 20 nm.

Figure 14:
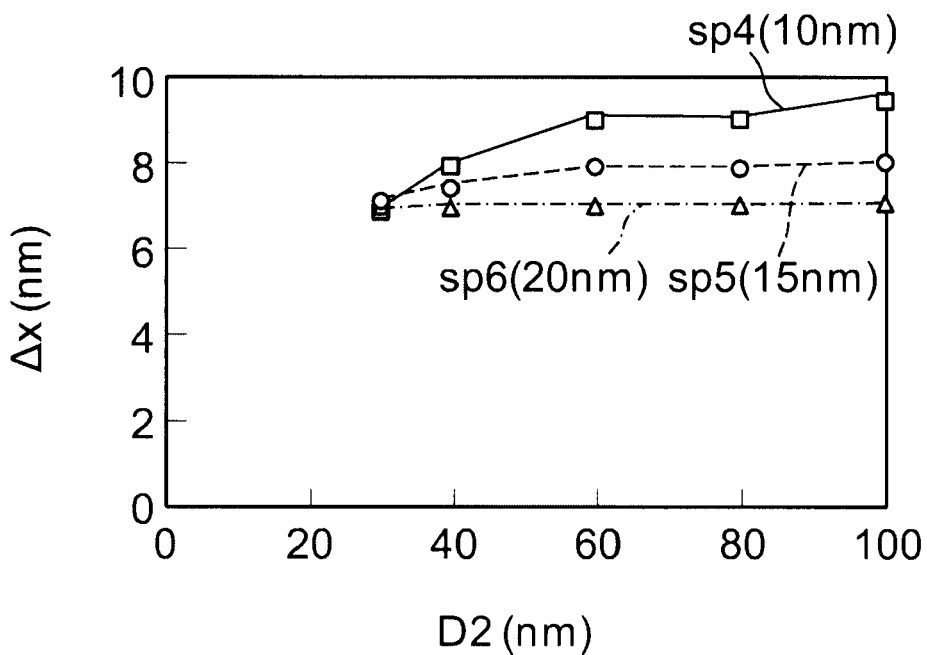
FIG. 14 is a graph showing characteristics of the magnetic recording element.

FIG. 14 is a graph illustrating characteristics of the magnetic recording element.

FIG. 14 illustrates the result of a simulation of the distance $\Delta x$ from the outer edge of the position where the magnetic field strength Hp in the in-plane direction becomes half when the thickness of the fourth ferromagnetic layer 40 is changed. The horizontal axis is the second diameter D2. The vertical axis is the distance $\Delta x$.

A condition sp4 to a condition sp6 illustrated in FIG. 14 correspond to the cases where the thickness of the fourth ferromagnetic layer 40 is 10 nm, 15 nm, and 20 nm, respectively.

As can be seen from FIG. 14, in the case where the thickness of the fourth ferromagnetic layer 40 was 10 nm and the diameter of the third ferromagnetic layer 30 (the second diameter D2) was 100 nm, the distance $\Delta x$ was 9.5 nm. Furthermore, also in the case where the diameter was made larger than 20 nm, the distance $\Delta x$ was less than 10 nm.

From the above, in the case where the thickness of the fourth ferromagnetic layer 40 is not more than 20 nm, the magnetic recording unit may be placed 10 nm or more inward from the outer edge of the fourth ferromagnetic layer 40 (e.g. the outer edge of the magnetic field generation source).

In the embodiment, a configuration is possible in which the magnetic field from the first ferromagnetic layer 10 and the stray magnetic field from the fourth ferromagnetic layer 40 cancel each other in the position of the second ferromagnetic layer 20. Thereby, the asymmetrical responsiveness to the current passage direction can be improved when the magnetization of the second ferromagnetic layer 20 is reversed. The configuration described below is a structure achieving this.

In the case of such a configuration as cancels the stray magnetic field, the thickness of the fourth ferromagnetic layer 40 is preferably set to about 10 nm. In the following example, the outer edge of the magnetic recording unit is placed 7 nm or more inward from the outer edge of the fourth ferromagnetic layer 40 (e.g. the outer edge of the magnetic field generation source).

A magnetic recording element 121 according to a first specific example (see FIG. 1A to FIG. 1C) has a similar configuration to the magnetic recording element 110.

In the magnetic recording element 121, the diameter of the magnetic field generation source (the second diameter D2) is 100 nm. The fourth ferromagnetic layer 40 (thickness: 10 nm) is a perpendicular magnetic film of Ms=800 emu/cc and Ku=8 Merg/cm$^3$. The second nonmagnetic layer 20n is a Cu layer (thickness: 2 nm). The third ferromagnetic layer 30 (thickness: 2 nm) is an in-plane magnetic film of Ms=1000 emu/cc and Ku=5000 erg/cm$^3$.

The magnetic recording unit is stacked so that the film surface center of the magnetic field generation source and the film surface center of the magnetic recording unit may coincide with each other. The diameter of the magnetic recording unit (the first diameter D1) is 20 nm. The first ferromagnetic layer 10 (thickness: 10 nm) is a perpendicular magnetic film of Ms=800 emu/cc and Ku=8 Merg/cm$^3$. The first nonmagnetic layer 10n is a MgO layer (thickness: 1 nm). The second ferromagnetic layer 20 (thickness: 2 nm) is a perpendicular magnetic film of Ms=800 emu/cc and Ku=4 Merg/cm$^3$. The third nonmagnetic layer 30n is a Cu layer (thickness: 10 nm).

In the magnetic recording element 121, when a current of 14 microamperes (µA), that is, 3.6 MA/cm$^2$ is passed in the direction from the magnetic field generation source toward the magnetic recording unit in a state where the magnetization direction of the first ferromagnetic layer 10 is opposite to the magnetization direction of the second ferromagnetic layer 20, the magnetization is reversed in 3.4 ns.

When a current of 280 µA (3.6 MA/cm$^2$) is passed in a reference example in which the magnetic recording unit has a diameter of 100 nm (in regard to the second ferromagnetic layer 20, Ms=800 emu/cc and Ku=4.1 Merg/cm$^3$) and the magnetic recording unit and the magnetic field generation source have the same diameter, the magnetization is reversed in 4.4 ns.

Thus, by setting the cross-sectional area of the first stacked unit SB1 smaller than the cross-sectional area of the second stacked unit SB2, a quick magnetization reversal is obtained.

Magnetic recording elements 122 to 125 according to a second to a fifth specific example (see FIG. 5A, FIG. 7A, FIG. 8A, and FIG. 9A) have similar configurations to the magnetic recording elements 110a, 110e, 110g, and 110i, respectively.

In the magnetic recording elements 122 to 125, the diameter of the magnetic field generation source, the configuration of the fourth ferromagnetic layer 40, the configuration of the second nonmagnetic layer 20n, the configuration of the third ferromagnetic layer 30, the diameter of the magnetic recording unit, the configuration of the first ferromagnetic layer 10, the configuration of the first nonmagnetic layer 10n, and the configuration of the second ferromagnetic layer 20 are similar to those of the magnetic recording element 121.

In the magnetic recording element 122, the strength of the magnetic field generated from the third ferromagnetic layer 30 in the position of the second ferromagnetic layer 20 changes depending on the design of the third nonmagnetic layer 30n.

In order that the magnetization reversal of the magnetic recording unit may be effectively assisted by the magnetic field generated from the magnetic field generation source, a magnetic field of about several percent of the anisotropic magnetic field of the second ferromagnetic layer 20 is needed. The assist effect improves as the magnetic field increases.

Figure 15:
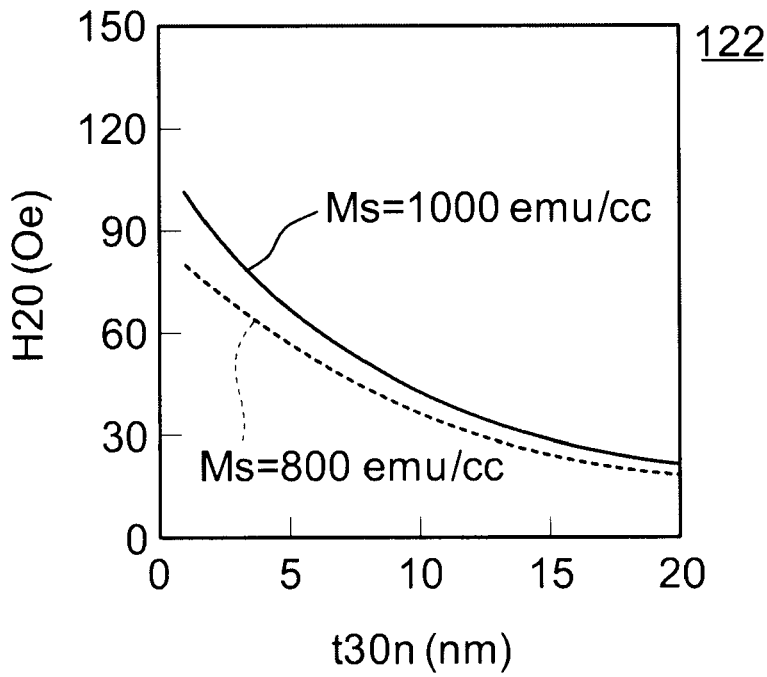
FIG. 15 is a graph showing characteristics of the magnetic recording element according to the embodiment.

FIG. 15 is a graph illustrating characteristics of the magnetic recording element according to the embodiment.

The drawing illustrates the result of a simulation of the magnetic field strength H20 in the position of the second ferromagnetic layer 20 in the configuration of the magnetic recording element 122 when the thickness t30n (see FIG. 1B) of the third nonmagnetic layer 30 is changed. The drawing illustrates results in the case where the Ms of the magnetic field generation source is 800 emu/cc and the case where it is 1000 emu/cc.

As can be seen from FIG. 15, when the Ms of the third ferromagnetic layer 30 is 1000 emu/cc, the thickness of the third nonmagnetic layer 30n is set to 1 nm in order to obtain a strength of 1% of the anisotropic magnetic field.

From the results, in the magnetic recording element 122, a Cu layer (thickness: 1 nm) is used as the third nonmagnetic layer 30n.

In the magnetic recording element 122, when a current of 14 µA (3.6 MA/cm$^2$) is passed in the direction from the magnetic field generation source toward the magnetic recording unit in a state where the magnetization direction of the first ferromagnetic layer 10 is opposite to the magnetization direction of the second ferromagnetic layer, the magnetization is reversed in 3.4 ns.

In the magnetic recording element 122, since the rotation direction of the generated magnetic field and the direction of the precession of the magnetization of the magnetic recording unit coincide with each other, the magnetization reversal occurs more quickly.

Figure 16:
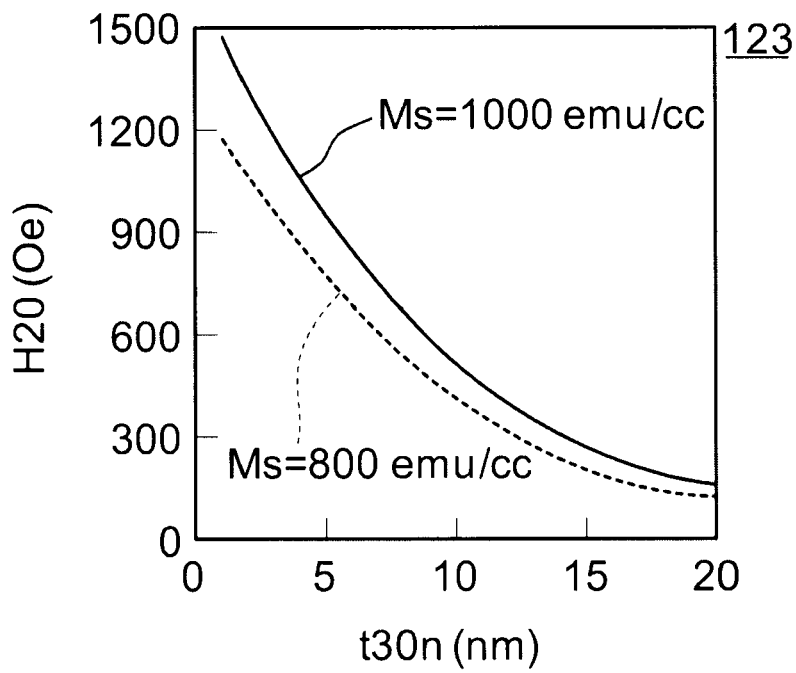
FIG. 16 is a graph showing characteristics of the magnetic recording element according to the embodiment.

FIG. 16 is a graph illustrating characteristics of the magnetic recording element according to the embodiment.

The drawing illustrates the result of a simulation of the magnetic field strength H20 in the position of the second ferromagnetic layer 20 in the configuration of the magnetic recording element 123 when the thickness t30n of the third nonmagnetic layer 30n is changed.

As can be seen from FIG. 16, when the Ms of the third ferromagnetic layer 30 is 1000 emu/cc, a strength of 5% of the anisotropic magnetic field is obtained in the case where the thickness t30n of the third nonmagnetic layer 30n is 10 nm. In the magnetic recording element 123, the distance between the second ferromagnetic layer 20 and the third ferromagnetic layer 30 is shorter than that of the second specific example (the magnetic recording element 122). Therefore, the magnetic field strength for obtaining the assist effect is reduced in the magnetic recording element 123.

In the magnetic recording element 123, preferably no spin torque is transferred between the second ferromagnetic layer 20 and the third ferromagnetic layer 30.

From the above results, a Ru layer (thickness: 10 nm) is used as the third nonmagnetic layer 30n.

In the magnetic recording element 123, when a current of 14 µA (3.6 MA/cm$^2$) is passed in the direction from the magnetic field generation source toward the magnetic recording unit in a state where the magnetization direction of the first ferromagnetic layer 10 is opposite to the magnetization direction of the second ferromagnetic layer 20, the magnetization is reversed in 2.1 ns.

In the magnetic recording element 123, a large magnetic field strength of 5% of the anisotropic magnetic field is obtained, as well as the rotation direction of the generated magnetic field and the direction of the precession of the magnetization of the magnetic recording unit coincide with each other. Therefore, the magnetization reversal occurs still more quickly.

Figure 17:
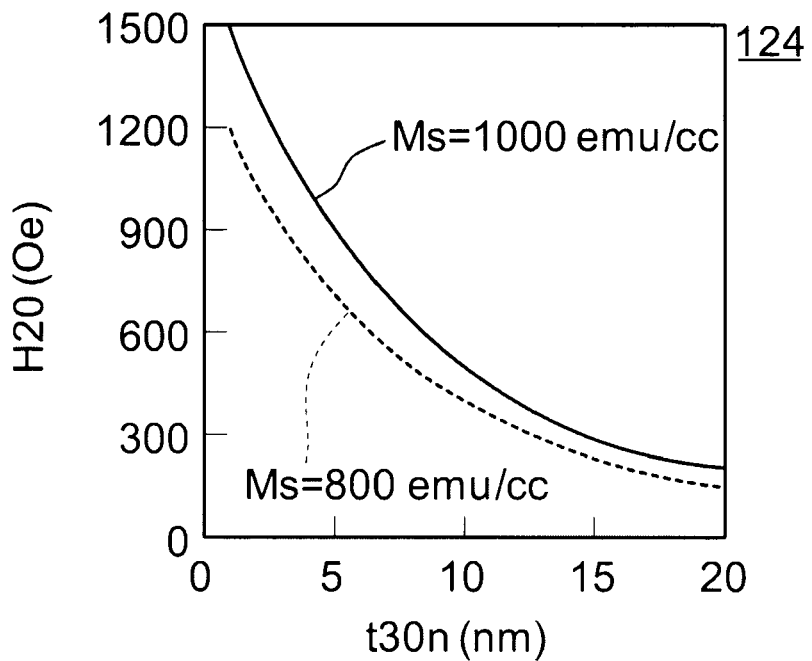
FIG. 17 is a graph showing characteristics of the magnetic recording element according to the embodiment.

FIG. 17 is a graph illustrating characteristics of the magnetic recording element according to the embodiment.

The drawing illustrates the result of a simulation of the magnetic field strength H20 in the position of the second ferromagnetic layer 20 in the configuration of the magnetic recording element 124 when the thickness t30n of the third nonmagnetic layer 30n is changed.

As can be seen from FIG. 17, when the Ms of the third ferromagnetic layer 30 is 1000 emu/cc, a strength of 3% of the anisotropic magnetic field is obtained in the case where the thickness t30n of the third nonmagnetic layer 30n is 5 nm. Also in this case, the distance between the second ferromagnetic layer 20 and the third ferromagnetic layer 30 is shorter than that of the second specific example (the magnetic recording element 122). Therefore, also in the magnetic recording element 124, only low magnetic field strength is required to obtain the assist effect.

Based on the results, a Cu layer (thickness: 5 nm) is used as the third nonmagnetic layer 30n in the magnetic recording element 124.

In the magnetic recording element 124, a magnetic field of 5 kOe is applied from the magnetic recording unit toward the magnetic field generation source in order to cause the rotation direction of the generated magnetic field and the direction of the precession of the magnetization of the second ferromagnetic layer 20 to coincide with each other.

In the magnetic recording element 124, when a current of 14 μA (3.6 MA/cm$^2$) is passed in the direction from the magnetic field generation source toward the magnetic recording unit in a state where the magnetization direction of the first ferromagnetic layer 10 is opposite to the magnetization direction of the second ferromagnetic layer, the magnetization is reversed in 2.8 ns.

Also in the magnetic recording element 124, since the rotation direction of the generated magnetic field and the direction of the precession of the magnetization of the magnetic recording unit coincide with each other, the magnetization reversal occurs still more quickly.

Figure 18:
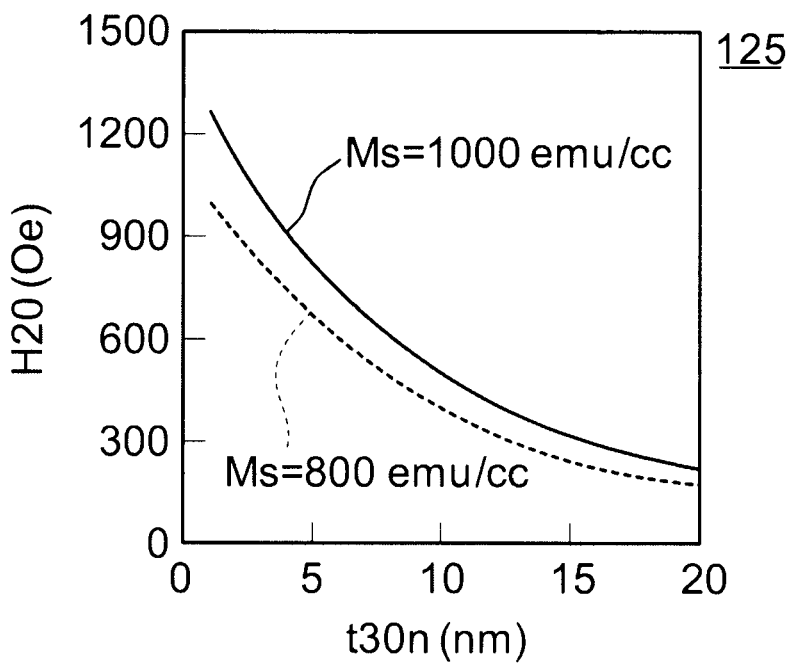
FIG. 18 is a graph showing characteristics of the magnetic recording element according to the embodiment.

FIG. 18 is a graph illustrating characteristics of the magnetic recording element according to the embodiment.

The drawing illustrates the result of a simulation of the magnetic field strength H20 in the position of the second ferromagnetic layer 20 in the configuration of the magnetic recording element 125 when the thickness t30n of the third nonmagnetic layer 30n is changed.

As can be seen from FIG. 18, when the Ms of the third ferromagnetic layer 30 is 1000 emu/cc, a strength of 2% of the anisotropic magnetic field is obtained in the case where the thickness t30n of the third nonmagnetic layer 30n is 2 nm. Also in this case, the distance between the second ferromagnetic layer 20 and the third ferromagnetic layer 30 is shorter than that of the second specific example (the magnetic recording element 122). Therefore, also in the magnetic recording element 125, the magnetic field strength for obtaining the assist effect is low.

Based on the results, in the magnetic recording element 125, a Cu layer (thickness: 2 nm) is used as the third nonmagnetic layer 30n.

In the magnetic recording element 125, a magnetic field of 5 kOe is applied from the magnetic recording unit toward the magnetic field generation source in order to cause the rotation direction of the generated magnetic field and the direction of the precession of the magnetization of the second ferromagnetic layer 20 to coincide with each other.

In the magnetic recording element 125, when a current of 14 μA (3.6 MA/cm$^2$) is passed in the direction from the magnetic field generation source toward the magnetic recording unit in a state where the magnetization direction of the first ferromagnetic layer 10 is opposite to the magnetization direction of the second ferromagnetic layer 20, the magnetization is reversed in 3.1 ns.

Also in the magnetic recording element 125, since the rotation direction of the generated magnetic field and the direction of the precession of the magnetization of the magnetic recording unit coincide with each other, the magnetization reversal occurs still more quickly.

Figure 19:
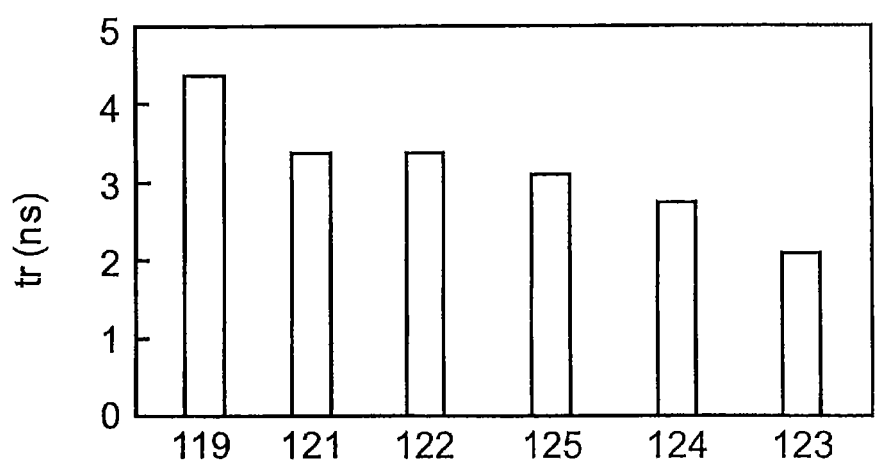
FIG. 19 is a graph showing characteristics of the magnetic recording element.

FIG. 19 is a graph illustrating characteristics of the magnetic recording element.

More specifically, the drawing shows the time tr required for the magnetization reversal in the magnetic recording elements 121, 122, 123, 124, and 125 of the specific examples mentioned above. Furthermore, the drawing shows the time tr required for the magnetization reversal in a magnetic recording element 119 (D1=D2=20 nm) of a reference example in which the diameter of the magnetic recording unit is the same as the diameter of the magnetic field generation source.

As shown in FIG. 19, whereas the time tr required for the magnetization reversal is 4.4 ns in the magnetic recording element 119 of the reference example, the time tr is 2.1 ns to 3.4 ns in the magnetic recording elements 121 to 125 according to the embodiment. Thus, according to the embodiment, the magnetization reversal occurs quickly.

Although examples in which the film surface center of the magnetic recording unit coincides with the film surface center of the magnetic field generation source are described in the first to fifth specific examples (the magnetic recording elements 121 to 125), the mutual positional relationship is arbitrary. In the embodiment, for example, a configuration is used in which the outer edge of the magnetic recording unit (the outer edge SBP1 of the first stacked unit SB1) is located inside the outer edge of the fourth ferromagnetic layer 40 (e.g. the outer edge SBP2 of the second stacked unit SB2 which is the magnetic field generation source) and the distance between the outer edges (the distance Dd) is not less than 7 nm. Thereby, a quick magnetization reversal is similarly obtained.

In the examples mentioned above, the sizes (widths) of the third ferromagnetic layer 30 and the second nonmagnetic layer are the same as the size (width) of the fourth ferromagnetic layer 40. That is, in the examples mentioned above, the outer edges of the third ferromagnetic layer 30 and the second nonmagnetic layer 20n in a plane normal to the stacking direction SD1 have a portion outside the outer edge of the first stacked unit SB1 in the plane. The processing of the third ferromagnetic layer 30 and the second nonmagnetic layer 20n is performed simultaneously and collectively with the processing of the fourth ferromagnetic layer 40, for example. Thereby, a high productivity is achieved in accordance with the material and process used.

Figure 20A:
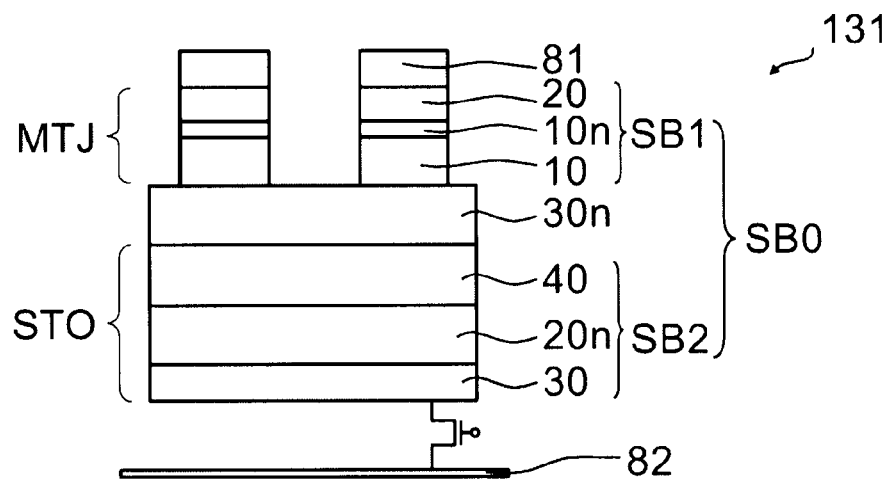
FIG. 20A to FIG. 20C are schematic views showing magnetic recording elements according to the embodiment.
Figure 20B:
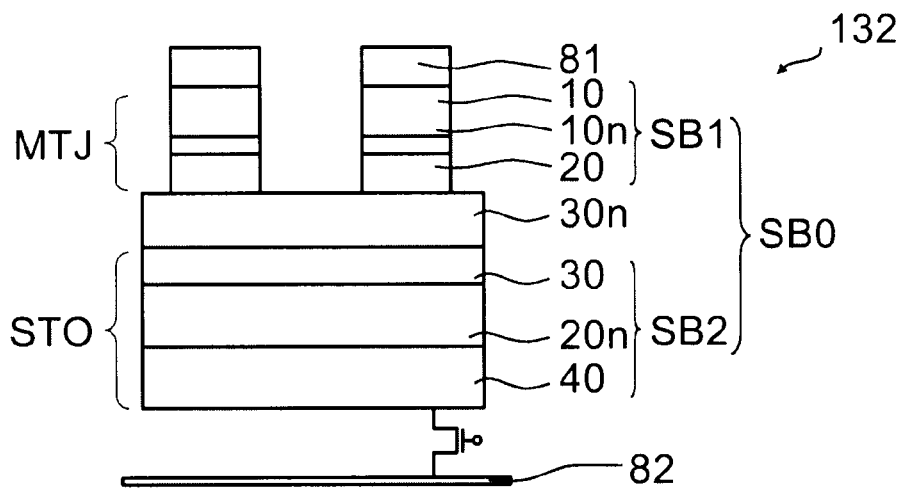
Figure 20C:
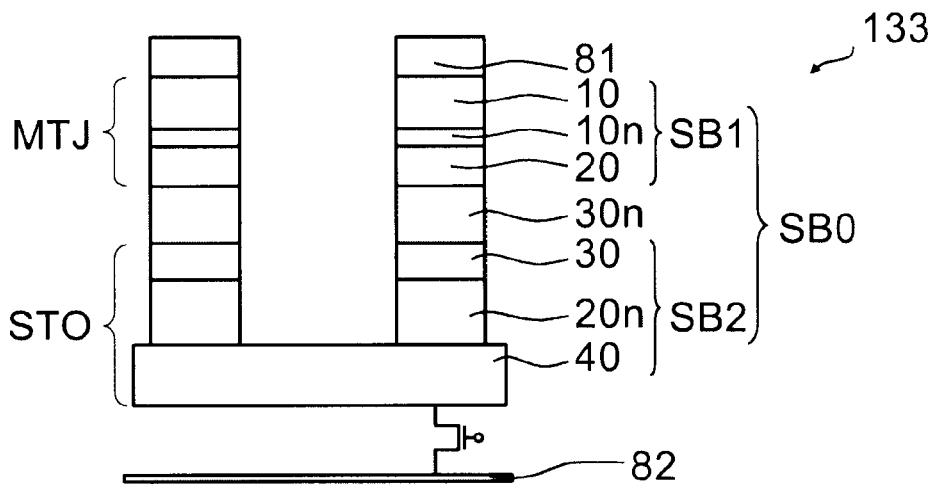

FIG. 20A to FIG. 20C are schematic views illustrating the configurations of magnetic recording elements according to the embodiment.

As shown in FIG. 20A and FIG. 20B, in magnetic recording elements 131 and 132 according to the embodiment, a plurality of magnetic recording units (the first stacked units SB1) are provided for one magnetic field generation source (the second stacked unit SB2). A first interconnection 81 (e.g.

a bit line BL) is connected to one end of the magnetic recording unit. A second interconnection 82 is connected to one end of the magnetic field generation source. In this example, a transistor (e.g. a selection transistor) is provided between the magnetic field generation source and the second interconnection. Also in this case, the outer edges of the plurality of magnetic recording units are placed 7 nm or more inward from the outer edge of the magnetic field generation source.

As shown in FIG. 20C, in a magnetic recording element 133 according to the embodiment, a stacked body of a plurality of third ferromagnetic layers 30, second nonmagnetic layers 20n, second ferromagnetic layers 20, first nonmagnetic layers 10n, and first ferromagnetic layers 10 is provided for one fourth ferromagnetic layer 40. In this example, the size (width) of the third ferromagnetic layer 30 is different from the size (width) of the fourth ferromagnetic layer 40. Also in this example, however, the outer edge of the fourth ferromagnetic layer 40 includes a portion outside the outer edge of the first stacked unit SB1. Thereby, a quick magnetization reversal is obtained.

In this example, the position of the outer edge of the third ferromagnetic layer 30 and the position of the outer edge of the second nonmagnetic layer 20n are the same as the position of the outer edge of the first stacked unit SB1. The processing of the third ferromagnetic layer 30 and the second nonmagnetic layer 20n is performed simultaneously and collectively with the processing of the first stacked unit SB1, for example. Thereby, a high productivity is achieved in accordance with the material and process used.

Figure 21A:
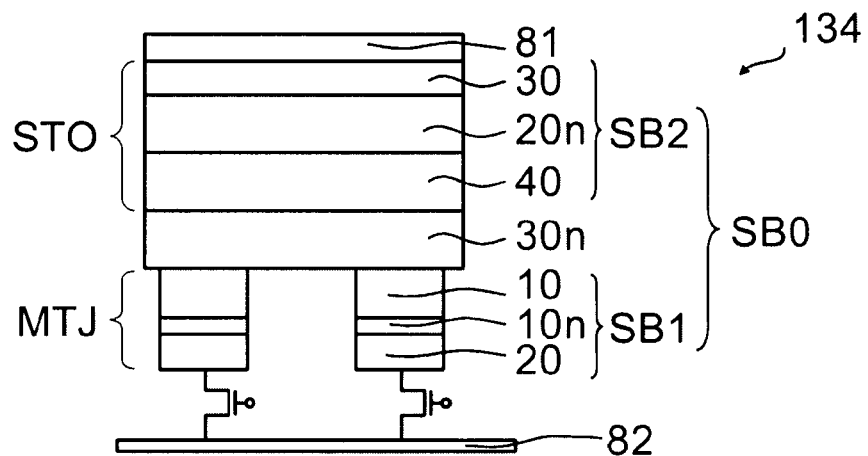
FIG. 21A to FIG. 21C are schematic views showing magnetic recording elements according to the embodiment.
Figure 21B:
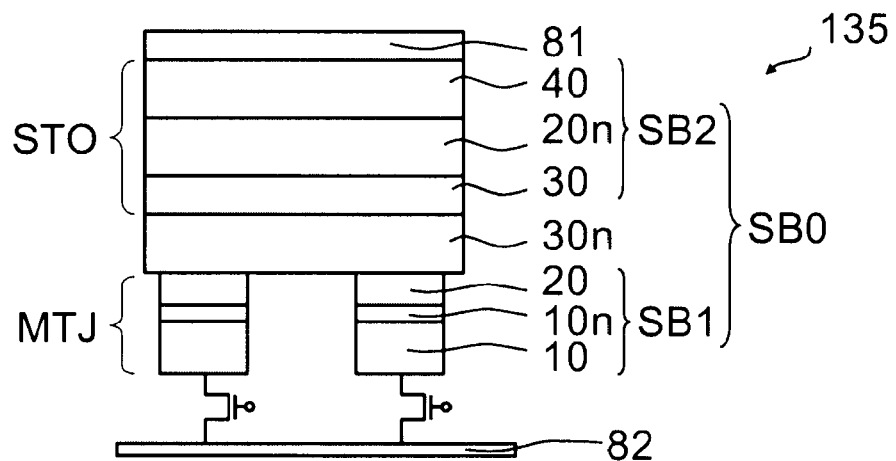
Figure 21C:
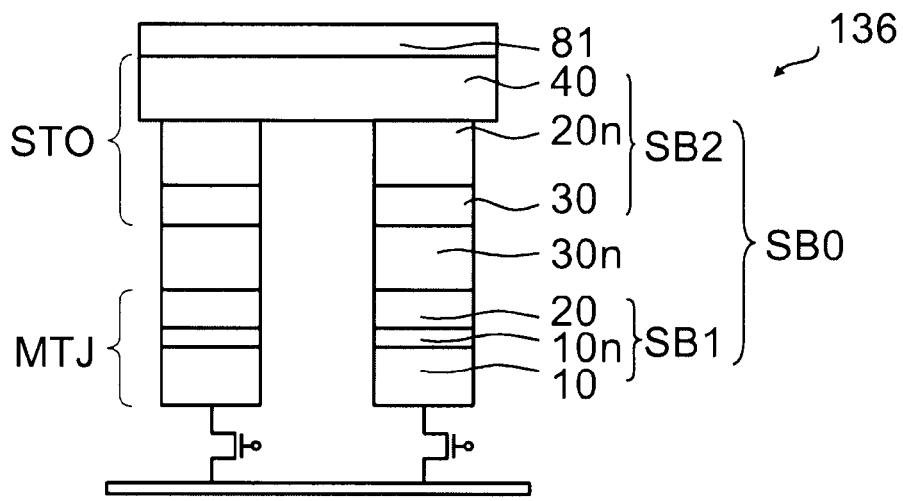

FIG. 21A to FIG. 21C are schematic views illustrating the configurations of magnetic recording elements according to the embodiment.

As shown in FIG. 21A and FIG. 21B, in magnetic recording elements 134 and 135 according to the embodiment, a plurality of magnetic recording units (the first stacked units SB1) are provided for one magnetic field generation source (the second stacked unit SB2). The first interconnection 81 (e.g. the bit line BL) is connected to one end of the magnetic field generation source. The second interconnection 82 is connected to one end of the magnetic recording unit. In this example, a transistor (e.g. a selection transistor) is provided between the magnetic recording unit and the second interconnection 82. Also in this case, the outer edges of the plurality of magnetic recording units are placed 7 nm or more inward from the outer edge of the magnetic field generation source.

As shown in FIG. 21C, in a magnetic recording element 136 according to the embodiment, a stacked body of a plurality of third ferromagnetic layers 30, second nonmagnetic layers 20n, second ferromagnetic layers 20, first nonmagnetic layers 10n, and first ferromagnetic layers 10 is provided for one fourth ferromagnetic layer 40. Also in this example, although the size (width) of the third ferromagnetic layer 30 is different from the size (width) of the fourth ferromagnetic layer 40, the outer edge of the fourth ferromagnetic layer 40 includes a portion outside the outer edge of the first stacked unit SB1. Thereby, a quick magnetization reversal is obtained.

The magnetic recording elements 131 to 136 are nonvolatile memory devices. The nonvolatile memory devices include the magnetic recording element. The nonvolatile memory devices include an array of magnetic recording elements.

The nonvolatile memory device according to the embodiment includes the magnetic recording element according to the embodiment, the first interconnection 81 connected to one end of the magnetic recording element, and the second interconnection 82 connected to the other end of the magnetic recording element.

The nonvolatile memory device according to the embodiment may further include a selection transistor provided at least one of between the magnetic recording element and the first interconnection 81 and between the magnetic recording element and the second interconnection 82.

Figure 22:
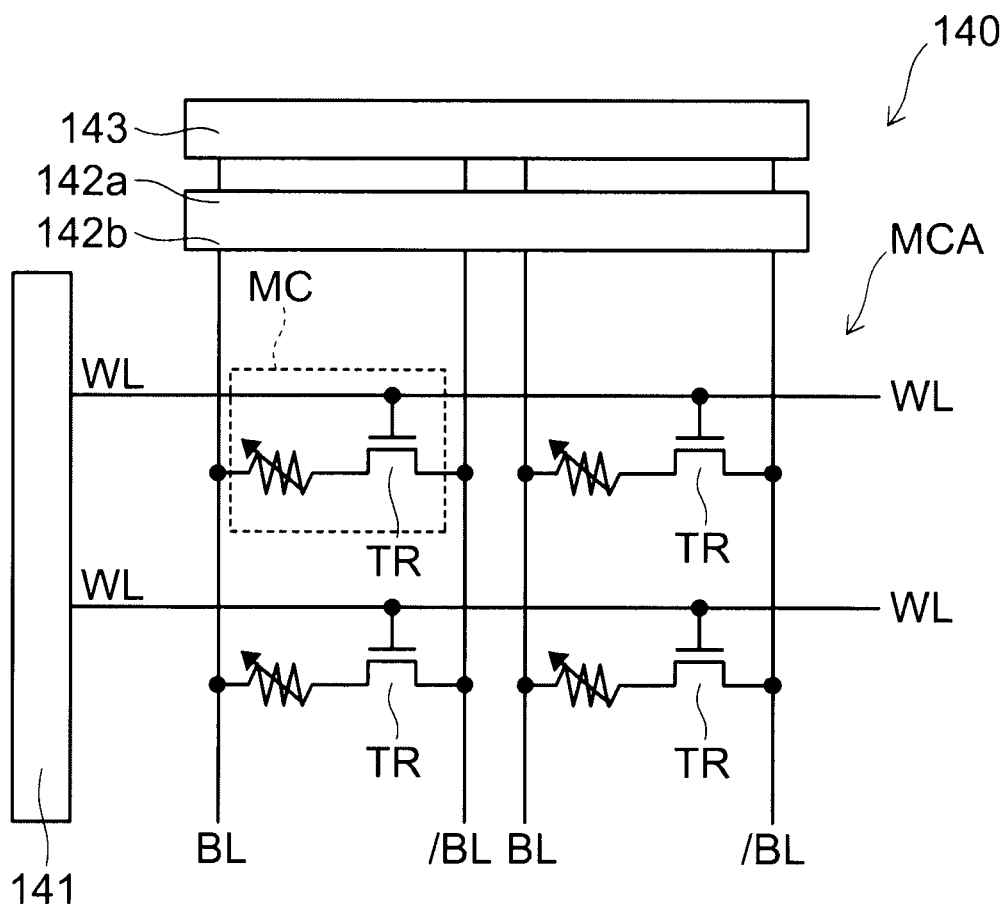
FIG. 22 is a schematic view showing the configuration of a nonvolatile memory device according to the embodiment.

FIG. 22 is a schematic view illustrating the configuration of a nonvolatile memory device according to the embodiment.

As shown in FIG. 22, a nonvolatile memory device 140 according to the embodiment includes a memory cell array MCA. The memory cell array MCA includes a plurality of memory cells MC arranged in a matrix configuration.

Each memory cell MC includes one of the magnetic recording elements according to the embodiment as an MTJ element.

In the memory cell array MCA, a plurality of bit line pairs (the bit line BL and a bit line/BL) are arranged so as to each extend in the column direction. In the memory cell array MCA, a plurality of word lines WL are arranged so as to each extend in the row direction.

The memory cell MC is placed at the intersection of the bit line BL and the word line WL. Each memory cell MC includes the MTJ element and a selection transistor TR. One end of the MTJ element is connected to the bit line BL. The other end of the MTJ element is connected to the drain terminal of the selection transistor TR. The gate terminal of the selection transistor TR is connected to the word line WL. The source terminal of the selection transistor TR is connected to the bit line/BL.

A row decoder 141 is connected to the word line WL. A write circuit 142a and a read circuit 142b are connected to the bit line pair (the bit line BL and the bit line/BL). A column decoder 143 is connected to the write circuit 142a and the read circuit 142b.

Each memory cell MC is selected by the row decoder 141 and the column decoder 143. An example of the data writing to the memory cell MC is as follows. First, to select a memory cell MC to perform data writing on, the word line WL connected to the memory cell MC is activated. Thereby, the selection transistor TR is switched to ON.

Here, a bidirectional write current is supplied to the MTJ element. Specifically, in the case where a write current is supplied to the MTJ element from left to right, the write circuit 142a applies a positive potential to the bit line BL and applies the ground potential to the bit line/BL. In the case where a write current is supplied to the MTJ element from right to left, the write circuit 142a applies a positive potential to the bit line/BL and applies the ground potential to the bit line BL. Thus, data "0" or data "1" can be written to the memory cell MC.

An example of the data reading from the memory cell MC is as follows. First, a memory cell MC is selected. The read circuit 142b supplies, for example, a read current flowing from right to left to the MTJ element. Then, the read circuit 142b detects the resistance value of the MTJ element based on this read current. Thus, the information stored in the MTJ element can be read out.

The embodiment provides a magnetic recording element and a nonvolatile memory device in which the magnetization reversal during writing occurs more quickly.

In the specification of this application, "perpendicular" and "parallel" refer to not only strictly perpendicular and strictly parallel but also include, for example, the variation due to manufacturing processes, etc. It is sufficient to be substantially perpendicular and substantially parallel.

Hereinabove, embodiments of the invention are described with reference to specific examples. However, the embodiment of the invention is not limited to these specific examples. For example, one skilled in the art may appropriately select specific configurations of components of magnetic recording elements such as ferromagnetic layers, nonmagnetic layers, and electrodes and components of nonvolatile memory devices such as interconnections and transistors from known art and similarly practice the invention. Such practice is included in the scope of the invention to the extent that similar effects thereto are obtained.

Further, any two or more components of the specific examples may be combined within the extent of technical feasibility; and such combinations are included in the scope of the invention to the extent that the purport of the invention is included.

Moreover, all magnetic recording elements and nonvolatile memory devices practicable by an appropriate design modification by one skilled in the art based on the magnetic recording elements and the nonvolatile memory devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic recording element comprising: a stacked body,
    the stacked body including:
        a first stacked unit including:
            a first ferromagnetic layer, a magnetization of the first ferromagnetic layer being fixed in a first direction having a component perpendicular to a layer surface of the first ferromagnetic layer;
            a second ferromagnetic layer, a direction of a magnetization of the second ferromagnetic layer being variable in a direction perpendicular to a layer surface of the second ferromagnetic layer; and
            a first nonmagnetic layer provided between the first ferromagnetic layer and the second ferromagnetic layer; and
        a second stacked unit stacked with the first stacked unit along a stacking direction, the first ferromagnetic layer, the second ferromagnetic layer, and the first nonmagnetic layer being stacked along the stacking direction, the second stacked unit including:
            a third ferromagnetic layer, a direction of a magnetization of the third ferromagnetic layer being variable in directions parallel to a layer surface of the third ferromagnetic layer;
            a fourth ferromagnetic layer stacked with the third ferromagnetic layer along the stacking direction, a magnetization of the fourth ferromagnetic layer being fixed in a second direction having a component perpendicular to a layer surface of the fourth ferromagnetic layer; and
            a second nonmagnetic layer provided between the third ferromagnetic layer and the fourth ferromagnetic layer,
    an outer edge of the fourth ferromagnetic layer projected onto a plane normal to the stacking direction including a portion outside an outer edge of the first stacked unit in the plane,
    a direction of the magnetization of the second ferromagnetic layer being configured to be determined to a direction in accordance with a direction of a current by causing an electron whose spin is polarized by passing the current through the stacked body along the stacking direction to act on the second ferromagnetic layer and by causing a rotating magnetic field generated from a precession of the magnetization of the third ferromagnetic layer to act on the second ferromagnetic layer.

2. The element according to claim 1, wherein an outer edge of the third ferromagnetic layer in the plane and an outer edge of the second nonmagnetic layer in the plane include a portion outside the outer edge of the first stacked unit in the plane.

3. The element according to claim 1, wherein the first direction is opposite to the second direction.

4. The element according to claim 1, wherein
    the stacked body further includes a third nonmagnetic layer provided between the first stacked unit and the second stacked unit and
    the third nonmagnetic layer includes at least one nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), bismuth (Bi), iridium (Ir), and osmium (Os) or an alloy including two or more selected from the group.

5. The element according to claim 1, wherein
    the stacked body further includes a third nonmagnetic layer provided between the first stacked unit and the second stacked unit and
    the third nonmagnetic layer includes a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two or more selected from the group.

6. The element according to claim 1, wherein
    the stacked body further includes a third nonmagnetic layer provided between the first stacked unit and the second stacked unit,
    the third nonmagnetic layer includes a metal selected from the group consisting of ruthenium (Ru), osmium (Os), and iridium (Ir) or an alloy including at least two or more selected from the group, and
    a thickness of the third nonmagnetic layer is not more than three nanometers.

7. The element according to claim 1, wherein a distance between a position of the portion projected onto the plane and a position of the outer edge of the first stacked unit projected onto the plane is not less than seven nanometers.

8. The element according to claim 1, wherein the outer edge of the fourth ferromagnetic layer is outside the outer edge of the first stacked unit.

9. The element according to claim 8, wherein a shortest distance between a position of the outer edge of the fourth ferromagnetic layer projected onto the plane and a position of the outer edge of the first stacked unit projected onto the plane is seven nanometers.

10. The element according to claim 1, further comprising a magnetic shield opposed to at least a part of a side surface of the stacked body.

11. The element according to claim 10, further comprising a protection layer provided between at least the part of the side surface of the stacked body and the magnetic shield.

12. The element according to claim 1, wherein
the stacked unit further includes a third nonmagnetic layer provided between the first stacked unit and the second stacked unit,
the first ferromagnetic layer is disposed between the second ferromagnetic layer and the fourth ferromagnetic layer,
the fourth ferromagnetic layer is disposed between the first ferromagnetic layer and the third ferromagnetic layer, and
the third nonmagnetic layer is disposed between the first ferromagnetic layer and the fourth ferromagnetic layer.

13. The element according to claim 1, wherein
the stacked unit further includes a third nonmagnetic layer provided between the first stacked unit and the second stacked unit,
the second ferromagnetic layer is disposed between the first ferromagnetic layer and the third ferromagnetic layer,
the third ferromagnetic layer is disposed between the second ferromagnetic layer and the fourth ferromagnetic layer, and
the third nonmagnetic layer is disposed between the second ferromagnetic layer and the third ferromagnetic layer.

14. The element according to claim 1, wherein
the stacked unit further includes a third nonmagnetic layer provided between the first stacked unit and the second stacked unit,
the first ferromagnetic layer is disposed between the second ferromagnetic layer and the third ferromagnetic layer,
the third ferromagnetic layer is disposed between the first ferromagnetic layer and the fourth ferromagnetic layer, and
the third nonmagnetic layer is disposed between the first ferromagnetic layer and the third ferromagnetic layer.

15. The element according to claim 1, wherein
the stacked unit further includes a third nonmagnetic layer provided between the first stacked unit and the second stacked unit,
the second ferromagnetic layer is disposed between the first ferromagnetic layer and the fourth ferromagnetic layer,
the fourth ferromagnetic layer is disposed between the second ferromagnetic layer and the third ferromagnetic layer, and
the third nonmagnetic layer is disposed between the second ferromagnetic layer and the fourth ferromagnetic layer.

16. The element according to claim 1, wherein
a position of the outer edge of the fourth ferromagnetic layer in the plane is same as a position of an outer edge of the third ferromagnetic layer in the plane, and same as a position of an outer edge of the second nonmagnetic layer in the plane.

17. The element according to claim 16, wherein
a position of an outer edge of the first ferromagnetic layer in the plane is same as a position of an outer edge of the second ferromagnetic layer in the plane, and same as a position of an outer edge of the first nonmagnetic layer in the plane.

18. The element according to claim 1, wherein
the first ferromagnetic layer, the second ferromagnetic layer and the fourth ferromagnetic layer include a perpendicular magnetic film, and
the third ferromagnetic layer includes an in-plane magnetic film.

19. A nonvolatile memory device comprising:
a magnetic recording element including a stacked body, the stacked body including:
a first stacked unit including:
a first ferromagnetic layer, a magnetization of the first ferromagnetic layer being fixed in a first direction having a component perpendicular to a layer surface of the first ferromagnetic layer;
a second ferromagnetic layer, a direction of a magnetization of the second ferromagnetic layer being variable in directions perpendicular to a layer surface of the second ferromagnetic layer; and
a first nonmagnetic layer provided between the first ferromagnetic layer and the second ferromagnetic layer; and
a second stacked unit stacked with the first stacked unit along a stacking direction, the first ferromagnetic layer, the second ferromagnetic layer, and the first nonmagnetic layer being stacked along the stacking direction, the second stacked unit including:
a third ferromagnetic layer, a direction of a magnetization of the third ferromagnetic layer being variable in directions parallel to a layer surface of the third ferromagnetic layer;
a fourth ferromagnetic layer stacked with the third ferromagnetic layer along the stacking direction, a magnetization of the fourth ferromagnetic layer being fixed in a second direction having a component perpendicular to a layer surface of the fourth ferromagnetic layer; and
a second nonmagnetic layer provided between the third ferromagnetic layer and the fourth ferromagnetic layer,
an outer edge of the fourth ferromagnetic layer projected onto a plane normal to the stacking direction including a portion outside an outer edge of the first stacked unit in the plane,
a direction of the magnetization of the second ferromagnetic layer being configured to be determined to a direction in accordance with a direction of a current by causing an electron whose spin is polarized by passing the current through the stacked body along the stacking direction to act on the second ferromagnetic layer and by causing a rotating magnetic field generated from a precession of the magnetization of the third ferromagnetic layer to act on the second ferromagnetic layer;
a first interconnection connected to one end of the magnetic recording element; and
a second interconnection connected to another end of the magnetic recording element.

20. The device according to claim 19, further comprising a selection transistor provided at least one of between the magnetic recording element and the first interconnection and between the magnetic recording element and the second interconnection.

\* \* \* \* \*